US011186917B2

(12) United States Patent
Shinde et al.

(10) Patent No.: US 11,186,917 B2
(45) Date of Patent: Nov. 30, 2021

(54) COMPOSITE ELECTRODES AND METHODS FOR THE FABRICATION AND USE THEREOF

(71) Applicants: THE BOARD OF TRUSTEES OF THE UNIVERSITY OF ALABAMA, Tuscaloosa, AL (US); THE ADMINISTRATORS OF THE TULANE EDUCATIONAL FUND, New Orleans, LA (US)

(72) Inventors: Pravin Shinde, Tuscaloosa, AL (US); James Donahue, River Ridge, LA (US); Patricia R. Fontenot, Kenner, LA (US); Arunava Gupta, Tuscaloosa, AL (US); Shanlin Pan, Tuscaloosa, AL (US)

(73) Assignees: THE BOARD OF TRUSTEES OF THE UNIVERSITY OF ALABAMA, Tuscaloosa, AL (US); THE ADMINISTRATORS OF THE TULANE EDUCATIONAL FUND, New Orleans, LA (US)

(*) Notice: Subject to any disclaimer, the term of this patent is extended or adjusted under 35 U.S.C. 154(b) by 341 days.

(21) Appl. No.: 16/259,043

(22) Filed: Jan. 28, 2019

(65) Prior Publication Data
US 2019/0233953 A1 Aug. 1, 2019

Related U.S. Application Data

(60) Provisional application No. 62/623,780, filed on Jan. 30, 2018.

(51) Int. Cl.
C25B 11/075 (2021.01)
C25B 1/04 (2021.01)
(Continued)

(52) U.S. Cl.
CPC .............. *C25B 11/075* (2021.01); *C25B 1/04* (2013.01); *C25B 1/55* (2021.01); *H01G 9/0029* (2013.01);
(Continued)

(58) Field of Classification Search
CPC ........... C25B 1/04; C25B 1/55; C25B 11/075; H01G 9/0029; H01G 9/2036
See application file for complete search history.

(56) References Cited

U.S. PATENT DOCUMENTS 3,481,781 A  12/1969  Kern
3,597,667 A  8/1971  Horn
(Continued)

FOREIGN PATENT DOCUMENTS

CN  105731820 A  7/2016
GB  2385602 A  8/2003

OTHER PUBLICATIONS

Azevedo, et al., "On the Stability Enhancement of Cuprous Oxide Water Splitting Photocathodes by Low Temperature Steam Annealing", Energ. Environ. Sci. 2014, 7, 4044-4052.
(Continued)

*Primary Examiner* — Ciel P Contreras
(74) *Attorney, Agent, or Firm* — Meunier Carlin & Curfman LLC

(57) ABSTRACT

Disclosed herein are precursor compounds, composite electrodes comprising the same, and methods of making and use thereof.

16 Claims, 11 Drawing Sheets

(51) Int. Cl.
*H01G 9/20* (2006.01)
*H01G 9/00* (2006.01)
*H01L 51/00* (2006.01)
*C25B 1/55* (2021.01)

(52) U.S. Cl.
CPC ......... *H01G 9/2036* (2013.01); *H01L 51/009* (2013.01); *H01L 2251/308* (2013.01)

(56) References Cited

U.S. PATENT DOCUMENTS

| | | | |
|---|---|---|---|
| 3,630,770 | A | 12/1971 | Favreau |
| 3,933,616 | A | 1/1976 | Beer |
| 4,099,198 | A | 7/1978 | Howorth et al. |
| 4,146,438 | A | 3/1979 | De Nora et al. |
| 4,331,528 | A | 5/1982 | Beer et al. |
| 4,511,638 | A | 4/1985 | Sapru et al. |
| 4,521,499 | A | 6/1985 | Switzer |
| 4,528,084 | A | 7/1985 | Beer et al. |
| 4,639,638 | A | 1/1987 | Purcell et al. |
| 5,882,723 | A | 3/1999 | Tsou |
| 6,194,346 | B1 | 2/2001 | Tada et al. |
| 6,521,349 | B1 | 2/2003 | Koenig et al. |
| 6,916,542 | B2 | 7/2005 | Buhay et al. |
| 7,081,320 | B2 | 7/2006 | Kawakami et al. |
| 7,309,664 | B1 | 12/2007 | Marzolin et al. |
| 2002/0187082 | A1 | 12/2002 | Wu et al. |
| 2003/0222579 | A1 | 12/2003 | Habib et al. |
| 2008/0039770 | A1 | 2/2008 | Francis et al. |
| 2009/0183994 | A1 | 7/2009 | Misra et al. |
| 2010/0133110 | A1 | 6/2010 | Nocera et al. |
| 2016/0017507 | A1* | 1/2016 | Dai ..................... C25B 11/043 204/242 |

OTHER PUBLICATIONS

Benck, et al., "Designing Active and Stable Silicon Photocathodes for Solar Hydrogen Production Using Molybdenum Sulfide Nanomaterials", Advanced Energy materials, 2014, 4(18), 1400739.
Benson, et al., "Electrocatalytic Hydrogen Evolution Reaction on Edges of a Few Layer Molybdenum Disulfide Nanodots", ACS Applied Materials and Interfaces, 2015, 7(25), 14113-14122.
Bornoz, et al., "A Bismuth Vanadate-Cuprous Oxide Tandem Cell for Overall Solar Water Splitting", J. Phys. Chem. C 2014, 118, 16959-16966.
Castellanos-Gomez, et al., "Local Strain Engineering in Atomically Thin MoS2", Nano Lett. 2013, 13, 5361-5366.
Chatterjee, et al., "Introducing Cu2O Thin Films as a Hole-Transport Layer in Efficient Planar Perovskite Solar Cell Structures", J. Phys. Chem. C 2016, 120, 1428-1437.
Chen, et al., "Silicon Decorated with Amorphous Cobalt Molybdenum Sulfide Catalyst as an Efficient Photocathode for Solar Hydrogen Generation", ACS Nano, 2015, 9(4), 3829-3836.
Choi, et al., "Interfacial Band-Edge Engineered TiO2 Protection Layer on Cu2O Photocathodes for Efficient Water Reduction Reaction", Electron. Mater. Lett. 2017, 13, 57-65.
Dubale, et al., "The Synergetic Effect of Graphene on Cu2O Nanowire Arrays as a Highly Efficient Hydrogen Evolution Photocathode in Water Splitting", J. Mater. Chem. A 2014, 2, 18383-18397.
Fedin, et al., "Triangular M3Se7^4+ and M3Se4^4+ complexes (M=Mo, W):An X-ray study of MO3Se7(Et2NCS2)4 and W3Se7(Et2NCS2)4", Inorganica Chimica Acta, 1991, 187(1).
Golden, et al., "Electrochemical Deposition of Copper(I) Oxide Films", Chem. Mater. 1996, 8, 2499-2504.
Kaneka, et al., "Chalcopyrite Thin Film Materials for Photochemical Hydrogen Evolution from Water under Sunlight", Coatings, 2015, 5(3), 293-311.
Laidoudi, et al., "Growth and characterization of electrodeposited Cu2O thin films", Sem. Sci. Technol. 2013, 28, 115005.
Lee, et al., "Scalable Binder-Free Supersonic Cold Spraying Of Nanotextured Cupric Oxide (CuO) Films As Efficient Photocathodes", ACS Appl. Mater. Interfaces 2016, 8, 15406-15414.
Levinas, et al., "Electrodeposition and study of molybdenum sulfide films", Open Readings, 2017, accessed May 29, 2019 at http://www.openreadings.eu/thesismanager/thesis17/484Levinas.pdf.
Lewis, NS, "Research Opportunities to Advance Solar Energy Utilization", Sci. 2016, 351(6271), aad1920.
Li, et al., "From Bulk to Monolayer MOS2: Evolution of Raman Scattering", Adv Funct Mater, 2012, 22, 1385-1390.
Li, et al., "Positive Onset Potential and Stability of Cu2O-Based Photocathodes in Water Splitting by Atomic Layer Deposition of a Ga2O3 Buffer Layer", Energ. Environ. Sci. 2015, 8, 1493-1500.
Liu, et al., "Growth of Large-Area and Highly Crystalline MoS2 Thin Layers on Insulating Substrates", Nano Letters, 2012, 12(3), 1538-1544.
Mahmood, et al., "Molybdenum Disulfide as the Interfacial Layer in the CuO—TiO2 Photocathode for Photoelectrochemical Cells", J. Mater. Sci. 2017, 28, 12937-12943.
McDonald, et al., "Syntheses and Characterization of Ammonium and Tetraalkylammonium Thiomolybdates and Thiotungstates", Inorg. Chim. Acta 1983, 72, 205-210.
Morales-Guio, et al., "Hydrogen Evolution from a Copper(I) Oxide Photocathode Coated with an Amorphous Molybdenum Sulphide Catalyst", Nat. Commun. 2014, 5, 3059.
Müller, et al., "Eine Einfache Darstellung der Binären Metall-Schwefel-Cluster [Mo3S13]2- und [Mo2S12]2- aus MoO42—in Praktisch Quantitativer Ausbeute", Chem. Ber. 1979, 112, 778-780.
Musa, et al., "Production of Cuprous Oxide, a Solar Cell Material, by Thermal Oxidation and a Study of its Physical and Electrical Properties", Sol. Energy Mater. Sol. Cells 1998, 51, 305-316.
Olsen, et al., "Experimental and Theoretical Studies of Cu2O Solar Cells", Solar Cells 1982, 7, 247-279.
Paracchino, et al., "Highly Active Oxide Photocathode for Photoelectrochemical Water Reduction", Nat. Mater. 2011, 10, 456-461.
Patel, et al., "CuO photocathode-embedded semitransparent photoelectrochemical cell", Journal of Materials research, 2016, 31(20), 3205-3213.
Paul, et al., "Defects in Cu2O Studied by Deep Level Transient Spectroscopy", Appl Phys Lett 2006, 88, 141901.
International Search Report and Written Opinion for Application No. PCT/US2019/015334, dated Mar. 28, 2019.
Prévot, et al., "Photoelectrochemical Tandem Cells for Solar Water Splitting", J. Phys. Chem. C 2013, 117, 17879-17893.
Qi, et al., "Cu2O Photocathode for Low Bias Photoelectrochemical Water Splitting Enabled by NiFe-Layered Double Hydroxide Co-Catalyst", Sci. Rep. 2016, 6, 30882.
Rice, et al., "Raman-Scattering Measurements and First-Principles Calculations of Strain-Induced Phonon Shifts in Monolayer MoS2", Phys Rev B 2013, 87, 081307.
Scanlon, et al., "Modeling the Polaronic Nature of p-type Defects in Cu2O: The Failure of GGA and GGA+U", J Chem Phys 2009, 131, 124703.
Tran, et al., "Copper molybdenum sulfide: a new efficient electrocatalyst for hydrogen production from water", Enegry & Environmental Science, 2012, 5, 8912-8916.
Yang, et al., "Cu2O/CuO Bilayered Composite as a High-Efficiency Photocathode for Photoelectrochemical Hydrogen Evolution Reaction", Sci. Rep. 2016, 6, 35158.
Yang, et al., "Engineering a Cu2O/NiO/Cu2MoS4 Hybrid Photocathode for H2 Generation in Water", Nanoscale 2014, 6, 6506-6510.
Yang, et al., "Lattice Strain Effects on the Optical Properties of MoS2 Nanosheets", Sci. Rep. 2014, 4, 5649.
Yang, et al., "Wafer-scale synthesis of thickness-controllable MoS2 films via solution-processing using a dimethylformamide/n-butylamine/2-aminoethanol solvent system", Nanoscale, 2015, 7, 9311-9319.
Zhang, et al., "Highly Stable Copper Oxide Composite as an Effective Photocathode for Water Splitting via a Facile Electrochemical Synthesis Strategy", J. Mater. Chem. 2012, 22, 2456-2464.

(56) References Cited

OTHER PUBLICATIONS

Zimmerman, et al., "Preparation of Complexes Containing the [Mo3S(S2)3]4+ Core and Structure of Tris(diethyldithiocarbamato)tris(m-disulfido)(m3-thio)-triangulo-trimolybdenum(IV) Iodide", Inorg. Chem. 1991, 30, 4336-4341.

\* cited by examiner

COMPOSITE ELECTRODES AND METHODS FOR THE FABRICATION AND USE THEREOF

CROSS-REFERENCE TO RELATED APPLICATIONS

This application claims the benefit of priority to U.S. Provisional Application No. 62/623,780, filed Jan. 30, 2018, which is hereby incorporated herein by reference in its entirety.

STATEMENT OF GOVERNMENT SUPPORT

This invention was made with government support under Grant No. OIA-1539035 and Grant No. CHE-1508192, both awarded by the National Science Foundation. The government has certain rights in the invention.

BACKGROUND

The rising concerns over the increasing global energy demand and negative impact on the environment of fossil fuels have stimulated great efforts towards developing clean and renewable energy alternatives (Lewis N S. *Science* 2016, 351, aad1920). Direct solar energy-driven photoelectrochemical (PEC) water splitting by employing photoanodes, photocathodes, or both in a tandem cell configuration offers a direct and sustainable way to generate hydrogen (Bornoz P et al. *J. Phys. Chem. C* 2014, 118, 16959-16966; Prévot M S et al. *J. Phys. Chem. C* 2013, 117, 17879-17893). Solar water splitting can be achieved via a photoelectrochemical cell comprised of a photoactive semiconductor/electrolyte junction, where the minority charge carriers (electrons for a p-type semiconductor) generated upon light absorption in the semiconductor are driven into the electrolyte by the electric field established at the junction to store energy as $H_2$. Low cost and efficient photoelectrodes that can be easily made are still needed. The compounds, electrodes, and methods described herein address these and other needs.

SUMMARY

Disclosed herein are precursor compounds, composite electrodes comprising the same, and methods of making and use thereof.

Additional advantages will be set forth in part in the description that follows, and in part will be obvious from the description, or may be learned by practice of the aspects described below. The advantages described below will be realized and attained by means of the elements and combinations particularly pointed out in the appended claims. It is to be understood that both the foregoing general description and the following detailed description are exemplary and explanatory only and are not restrictive.

The details of one or more embodiments of the invention are set forth in the accompanying figures and the description below. Other features, objects, and advantages of the invention will be apparent from the description, figures, and claims.

BRIEF DESCRIPTION OF FIGURES

The accompanying drawings, which are incorporated and constitute a part of this specification, illustrate several aspects of the disclosure, and together with the description, serve to explain the principles of the disclosure.

DETAILED DESCRIPTION

Figure 1:
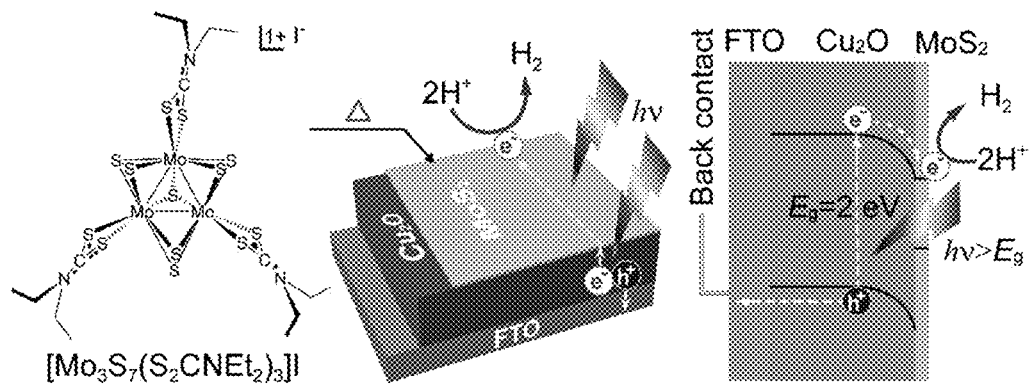
FIG. 1 is a schematic of a synthesis strategy to prepare surface-passivated $Cu_2O$ photocathode ($MoS_2/Cu_2O$/FTO) using $MoS_2$ (molecular structure of $MoS_2$ precursor is shown) as a bifunctional material to protect $Cu_2O$ and perform hydrogen evolution reaction catalysis for solar water splitting application.

The methods described herein may be understood more readily by reference to the following detailed description of specific aspects of the disclosed subject matter, figures and the examples included therein.

Before the present methods are disclosed and described, it is to be understood that the aspects described below are not intended to be limited in scope by the specific systems, methods, articles, and devices described herein, which are intended as illustrations. Various modifications of the systems, methods, articles, and devices in addition to those shown and described herein are intended to fall within the scope of that described herein. Further, while only certain representative systems and method steps disclosed herein are specifically described, other combinations of the systems and method steps also are intended to fall within the scope of that described herein, even if not specifically recited. Thus, a combination of steps, elements, components, or constituents may be explicitly mentioned herein or less, however, other combinations of steps, elements, components, and constituents are included, even though not explicitly stated.

General Definitions

The term "comprising" and variations thereof as used herein is used synonymously with the term "including" and variations thereof and are open, non-limiting terms. Although the terms "comprising" and "including" have been used herein to describe various examples, the terms "consisting essentially of" and "consisting of" can be used in place of "comprising" and "including" to provide for more specific examples of the invention and are also disclosed. Other than in the examples, or where otherwise noted, all numbers expressing quantities of ingredients, reaction conditions, and so forth used in the specification and claims are to be understood at the very least, and not as an attempt to limit the application of the doctrine of equivalents to the scope of the claims, to be construed in light of the number of significant digits and ordinary rounding approaches.

As used in the description and the appended claims, the singular forms "a," "an," and "the" include plural referents unless the context clearly dictates otherwise. Thus, for example, reference to "a composition" includes mixtures of two or more such compositions, reference to "an agent" includes mixtures of two or more such agents, reference to "the component" includes mixtures of two or more such components, and the like.

"Optional" or "optionally" means that the subsequently described event or circumstance can or cannot occur, and that the description includes instances where the event or circumstance occurs and instances where it does not.

It is understood that throughout this specification the identifiers "first", "second" and "third" are used solely to aid in distinguishing the various components and steps of the disclosed subject matter. The identifiers "first", "second" and "third" are not intended to imply any particular order, amount, preference, or importance to the components or steps modified by these terms.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

Chemical Definitions

Terms used herein will have their customary meaning in the art unless specified otherwise. The organic moieties mentioned when defining variable positions within the general formulae described herein (e.g., the term "halogen") are collective terms for the individual substituents encompassed by the organic moiety. The prefix $C_n$-$C_m$ preceding a group or moiety indicates, in each case, the possible number of carbon atoms in the group or moiety that follows.

References in the specification and concluding claims to parts by weight of a particular element or component in a composition denotes the weight relationship between the element or component and any other elements or components in the composition or article for which a part by weight is expressed. Thus, in a compound containing 2 parts by weight of component X and 5 parts by weight component Y, X and Y are present at a weight ratio of 2:5, and are present in such ratio regardless of whether additional components are contained in the compound.

A weight percent (wt. %) of a component, unless specifically stated to the contrary, is based on the total weight of the formulation or composition in which the component is included.

The term "ion," as used herein, refers to any molecule, portion of a molecule, cluster of molecules, molecular complex, moiety, or atom that contains a charge (positive, negative, or both at the same time within one molecule, cluster of molecules, molecular complex, or moiety (e.g., zwitterions)) or that can be made to contain a charge. Methods for producing a charge in a molecule, portion of a molecule, cluster of molecules, molecular complex, moiety, or atom are disclosed herein and can be accomplished by methods known in the art, e.g., protonation, deprotonation, oxidation, reduction, alkylation, acetylation, esterification, deesterification, hydrolysis, etc.

The term "anion" is a type of ion and is included within the meaning of the term "ion." An "anion" is any molecule, portion of a molecule (e.g., zwitterion), cluster of molecules, molecular complex, moiety, or atom that contains a net negative charge or that can be made to contain a net negative charge. The term "anion precursor" is used herein to specifically refer to a molecule that can be converted to an anion via a chemical reaction (e.g., deprotonation).

The term "cation" is a type of ion and is included within the meaning of the term "ion." A "cation" is any molecule, portion of a molecule (e.g., zwitterion), cluster of molecules, molecular complex, moiety, or atom, that contains a net positive charge or that can be made to contain a net positive charge. The term "cation precursor" is used herein to specifically refer to a molecule that can be converted to a cation via a chemical reaction (e.g., protonation or alkylation).

As used herein, the term "substituted" is contemplated to include all permissible substituents of organic compounds. In a broad aspect, the permissible substituents include acyclic and cyclic, branched and unbranched, carbocyclic and heterocyclic, and aromatic and nonaromatic substituents of organic compounds. Illustrative substituents include, for example, those described below. The permissible substituents can be one or more and the same or different for appropriate organic compounds. For purposes of this disclosure, the heteroatoms, such as nitrogen, can have hydrogen substituents and/or any permissible substituents of organic compounds described herein which satisfy the valencies of the heteroatoms. This disclosure is not intended to be limited in any manner by the permissible substituents of organic compounds. Also, the terms "substitution" or "substituted with" include the implicit proviso that such substitution is in accordance with permitted valence of the substituted atom and the substituent, and that the substitution results in a stable compound, e.g., a compound that does not spontaneously undergo transformation such as by rearrangement, cyclization, elimination, etc.

"$Z^1$," "$Z^2$," "$Z^3$," and "$Z^4$" are used herein as generic symbols to represent various specific substituents. These symbols can be any substituent, not limited to those disclosed herein, and when they are defined to be certain substituents in one instance, they can, in another instance, be defined as some other substituents.

The term "aliphatic" as used herein refers to a non-aromatic hydrocarbon group and includes branched and unbranched, alkyl, alkenyl, or alkynyl groups.

As used herein, the term "alkyl" refers to saturated, straight-chained or branched saturated hydrocarbon moieties. Unless otherwise specified, $C_1$-$C_{24}$ (e.g., $C_1$-$C_{22}$, $C_1$-$C_{20}$, $C_1$-$C_{18}$, $C_1$-$C_{16}$, $C_1$-$C_{14}$, $C_1$-$C_{12}$, $C_1$-$C_{10}$, $C_1$-$C_8$, $C_1$-$C_6$, or $C_1$-$C_4$) alkyl groups are intended. Examples of alkyl groups include methyl, ethyl, propyl, 1-methyl-ethyl, butyl, 1-methyl-propyl, 2-methyl-propyl, 1,1-dimethyl-ethyl, pentyl, 1-methyl-butyl, 2-methyl-butyl, 3-methyl-butyl, 2,2-dimethyl-propyl, 1-ethyl-propyl, hexyl, 1,1-dimethyl-propyl, 1,2-dimethyl-propyl, 1-methyl-pentyl, 2-methyl-pentyl, 3-methyl-pentyl, 4-methyl-pentyl, 1,1-dimethyl-butyl, 1,2-dimethyl-butyl, 1,3-dimethyl-butyl, 2,2-dimethyl-butyl, 2,3-dimethyl-butyl, 3,3-dimethyl-butyl, 1-ethyl-butyl, 2-ethyl-butyl, 1,1,2-trimethyl-propyl, 1,2,2-trimethyl-propyl, 1-ethyl-1-methyl-propyl, 1-ethyl-2-methyl-propyl, heptyl, octyl, nonyl, decyl, dodecyl, tetradecyl, hexadecyl, eicosyl, tetracosyl, and the like. Alkyl substituents may be unsubstituted or substituted with one or more chemical moieties. The alkyl group can be substituted with one or more groups including, but not limited to, hydroxyl, halogen, acyl, alkyl, alkoxy, alkenyl, alkynyl, aryl, heteroaryl, aldehyde, amino, cyano, carboxylic acid, ester, ether, ketone, nitro, phosphonyl, silyl, sulfo-oxo, sulfonyl, sulfone, sulfoxide, or thiol, as described below, provided that the substituents are sterically compatible and the rules of chemical bonding and strain energy are satisfied.

Throughout the specification "alkyl" is generally used to refer to both unsubstituted alkyl groups and substituted alkyl groups; however, substituted alkyl groups are also specifically referred to herein by identifying the specific substituent(s) on the alkyl group. For example, the term "halogenated alkyl" specifically refers to an alkyl group that is substituted with one or more halides (halogens; e.g., fluorine, chlorine, bromine, or iodine). The term "alkoxyalkyl" specifically refers to an alkyl group that is substituted with one or more alkoxy groups, as described below. The term "alkylamino" specifically refers to an alkyl group that is substituted with one or more amino groups, as described below, and the like. When "alkyl" is used in one instance and a specific term such as "alkylalcohol" is used in another, it is not meant to imply that the term "alkyl" does not also refer to specific terms such as "alkylalcohol" and the like.

This practice is also used for other groups described herein. That is, while a term such as "cycloalkyl" refers to both unsubstituted and substituted cycloalkyl moieties, the substituted moieties can, in addition, be specifically identified herein; for example, a particular substituted cycloalkyl can be referred to as, e.g., an "alkylcycloalkyl." Similarly, a substituted alkoxy can be specifically referred to as, e.g., a "halogenated alkoxy," a particular substituted alkenyl can be, e.g., an "alkenylalcohol," and the like. Again, the practice of using a general term, such as "cycloalkyl," and a specific term, such as "alkylcycloalkyl," is not meant to imply that the general term does not also include the specific term.

As used herein, the term "alkenyl" refers to unsaturated, straight-chained, or branched hydrocarbon moieties containing a double bond. Unless otherwise specified, $C_2$-$C_{24}$ (e.g., $C_2$-$C_{22}$, $C_2$-$C_{20}$, $C_2$-$C_{18}$, $C_2$-$C_{16}$, $C_2$-$C_{14}$, $C_2$-$C_{12}$, $C_2$-$C_{10}$, $C_2$-$C_8$, $C_2$-$C_6$, or $C_2$-$C_4$) alkenyl groups are intended. Alkenyl groups may contain more than one unsaturated bond. Examples include ethenyl, 1-propenyl, 2-propenyl, 1-methylethenyl, 1-butenyl, 2-butenyl, 3-butenyl, 1-methyl-1-propenyl, 2-methyl-1-propenyl, 1-methyl-2-propenyl, 2-methyl-2-propenyl, 1-pentenyl, 2-pentenyl, 3-pentenyl, 4-pentenyl, 1-methyl-1-butenyl, 2-methyl-1-butenyl, 3-methyl-1-butenyl, 1-methyl-2-butenyl, 2-methyl-2-butenyl, 3-methyl-2-butenyl, 1-methyl-3-butenyl, 2-methyl-3-butenyl, 3-methyl-3-butenyl, 1,1-dimethyl-2-propenyl, 1,2-dimethyl-1-propenyl, 1,2-dimethyl-2-propenyl, 1-ethyl-1-propenyl, 1-ethyl-2-propenyl, 1-hexenyl, 2-hexenyl, 3-hexenyl, 4-hexenyl, 5-hexenyl, 1-methyl-1-pentenyl, 2-methyl-1-pentenyl, 3-methyl-1-pentenyl, 4-methyl-1-pentenyl, 1-methyl-2-pentenyl, 2-methyl-2-pentenyl, 3-methyl-2-pentenyl, 4-methyl-2-pentenyl, 1-methyl-3-pentenyl, 2-methyl-3-pentenyl, 3-methyl-3-pentenyl, 4-methyl-3-pentenyl, 1-methyl-4-pentenyl, 2-methyl-4-pentenyl, 3-methyl-4-pentenyl, 4-methyl-4-pentenyl, 1,1-dimethyl-2-butenyl, 1,1-dimethyl-3-butenyl, 1,2-dimethyl-1-butenyl, 1,2-dimethyl-2-butenyl, 1,2-dimethyl-3-butenyl, 1,3-dimethyl-1-butenyl, 1,3-dimethyl-2-butenyl, 1,3-dimethyl-3-butenyl, 2,2-dimethyl-3-butenyl, 2,3-dimethyl-1-butenyl, 2,3-dimethyl-2-butenyl, 2,3-dimethyl-3-butenyl, 3,3-dimethyl-1-butenyl, 3,3-dimethyl-2-butenyl, 1-ethyl-1-butenyl, 1-ethyl-2-butenyl, 1-ethyl-3-butenyl, 2-ethyl-1-butenyl, 2-ethyl-2-butenyl, 2-ethyl-3-butenyl, 1,1,2-trimethyl-2-propenyl, 1-ethyl-1-methyl-2-propenyl, 1-ethyl-2-methyl-1-propenyl, and 1-ethyl-2-methyl-2-propenyl. The term "vinyl" refers to a group having the structure —CH=CH$_2$; 1-propenyl refers to a group with the structure —CH=CH—CH$_3$; and 2-propenyl refers to a group with the structure —CH$_2$—CH=CH$_2$. Asymmetric structures such as ($Z^1Z^2$)C=C($Z^3Z^4$) are intended to include both the E and Z isomers. This can be presumed in structural formulae herein wherein an asymmetric alkene is present, or it can be explicitly indicated by the bond symbol C=C. Alkenyl substituents may be unsubstituted or substituted with one or more chemical moieties. Examples of suitable substituents include, for example, alkyl, alkoxy, alkenyl, alkynyl, aryl, heteroaryl, acyl, aldehyde, amino, cyano, carboxylic acid, ester, ether, halide, hydroxyl, ketone, nitro, phosphonyl, silyl, sulfo-oxo, sulfonyl, sulfone, sulfoxide, or thiol, as described below, provided that the substituents are sterically compatible and the rules of chemical bonding and strain energy are satisfied.

As used herein, the term "alkynyl" represents straight-chained or branched hydrocarbon moieties containing a triple bond. Unless otherwise specified, $C_2$-$C_{24}$ (e.g., $C_2$-$C_{24}$, $C_2$-$C_{20}$, $C_2$-$C_{18}$, $C_2$-$C_{16}$, $C_2$-$C_{14}$, $C_2$-$C_{12}$, $C_2$-$C_{10}$, $C_2$-$C_8$, $C_2$-$C_6$, or $C_2$-$C_4$) alkynyl groups are intended. Alkynyl groups may contain more than one unsaturated bond. Examples include $C_2$-$C_6$-alkynyl, such as ethynyl, 1-propynyl, 2-propynyl (or propargyl), 1-butynyl, 2-butynyl, 3-butynyl, 1-methyl-2-propynyl, 1-pentynyl, 2-pentynyl, 3-pentynyl, 4-pentynyl, 3-methyl-1-butynyl, 1-methyl-2-butynyl, 1-methyl-3-butynyl, 2-methyl-3-butynyl, 1,1-dimethyl-2-propynyl, 1-ethyl-2-propynyl, 1-hexynyl, 2-hexynyl, 3-hexynyl, 4-hexynyl, 5-hexynyl, 3-methyl-1-pentynyl, 4-methyl-1-pentynyl, 1-methyl-2-pentynyl, 4-methyl-2-pentynyl, 1-methyl-3-pentynyl, 2-methyl-3-pentynyl, 1-methyl-4-pentynyl, 2-methyl-4-pentynyl, 3-methyl-4-pentynyl, 1,1-dimethyl-2-butynyl, 1,1-dimethyl-3-butynyl, 1,2-dimethyl-3-butynyl, 2,2-dimethyl-3-butynyl, 3,3-dimethyl-1-butynyl, 1-ethyl-2-butynyl, 1-ethyl-3-butynyl, 2-ethyl-3-butynyl, and 1-ethyl-1-methyl-2-propynyl. Alkynyl substituents may be unsubstituted or substituted with one or more chemical moieties. Examples of suitable substituents include, for example, alkyl, alkoxy, alkenyl, alkynyl, aryl, heteroaryl, acyl, aldehyde, amino, cyano, carboxylic acid, ester, ether, halide, hydroxyl, ketone, nitro, phosphonyl, silyl, sulfo-oxo, sulfonyl, sulfone, sulfoxide, or thiol, as described below.

As used herein, the term "aryl," as well as derivative terms such as aryloxy, refers to groups that include a monovalent aromatic carbocyclic group of from 3 to 50 carbon atoms. Aryl groups can include a single ring or multiple condensed rings. In some embodiments, aryl groups include $C_6$-$C_{10}$ aryl groups. Examples of aryl groups include, but are not limited to, benzene, phenyl, biphenyl, naphthyl, tetrahydronaphthyl, phenylcyclopropyl, phenoxybenzene, and indanyl. The term "aryl" also includes "heteroaryl," which is defined as a group that contains an aromatic group that has at least one heteroatom incorporated within the ring of the aromatic group. Examples of heteroatoms include, but are not limited to, nitrogen, oxygen, sulfur, and phosphorus. The term "non-heteroaryl," which is also included in the term "aryl," defines a group that contains an aromatic group that does not contain a heteroatom. The aryl substituents may be unsubstituted or substituted with one or more chemical moieties. Examples of suitable substituents include, for example, alkyl, alkoxy, alkenyl, alkynyl, aryl, heteroaryl, acyl, aldehyde, amino, cyano, carboxylic acid, ester, ether, halide, hydroxyl, ketone, nitro, phosphonyl, silyl, sulfo-oxo, sulfonyl, sulfone, sulfoxide, or thiol as described herein. The term "biaryl" is a specific type of aryl group and is included in the definition of aryl. Biaryl refers to two aryl groups that are bound together via a fused ring structure, as in naphthalene, or are attached via one or more carbon-carbon bonds, as in biphenyl.

The term "cycloalkyl" as used herein is a non-aromatic carbon-based ring composed of at least three carbon atoms. Examples of cycloalkyl groups include, but are not limited to, cyclopropyl, cyclobutyl, cyclopentyl, cyclohexyl, etc. The term "heterocycloalkyl" is a cycloalkyl group as defined above where at least one of the carbon atoms of the ring is substituted with a heteroatom such as, but not limited to, nitrogen, oxygen, sulfur, or phosphorus. The cycloalkyl group and heterocycloalkyl group can be substituted or unsubstituted. The cycloalkyl group and heterocycloalkyl group can be substituted with one or more groups including, but not limited to, alkyl, alkoxy, alkenyl, alkynyl, aryl, heteroaryl, acyl, aldehyde, amino, cyano, carboxylic acid, ester, ether, halide, hydroxyl, ketone, nitro, phosphonyl, silyl, sulfo-oxo, sulfonyl, sulfone, sulfoxide, or thiol as described herein.

The term "cycloalkenyl" as used herein is a non-aromatic carbon-based ring composed of at least three carbon atoms and containing at least one double bound, i.e., C=C. Examples of cycloalkenyl groups include, but are not limited to, cyclopropenyl, cyclobutenyl, cyclopentenyl, cyclopentadienyl, cyclohexenyl, cyclohexadienyl, and the like. The term "heterocycloalkenyl" is a type of cycloalkenyl group as defined above, and is included within the meaning of the term "cycloalkenyl," where at least one of the carbon atoms of the ring is substituted with a heteroatom such as, but not limited to, nitrogen, oxygen, sulfur, or phosphorus. The cycloalkenyl group and heterocycloalkenyl group can be substituted or unsubstituted. The cycloalkenyl group and heterocycloalkenyl group can be substituted with one or more groups including, but not limited to, alkyl, alkoxy, alkenyl, alkynyl, aryl, heteroaryl, acyl, aldehyde, amino, cyano, carboxylic acid, ester, ether, halide, hydroxyl, ketone, nitro, phosphonyl, silyl, sulfo-oxo, sulfonyl, sulfone, sulfoxide, or thiol as described herein.

The term "cyclic group" is used herein to refer to either aryl groups, non-aryl groups (i.e., cycloalkyl, heterocycloalkyl, cycloalkenyl, and heterocycloalkenyl groups), or both. Cyclic groups have one or more ring systems that can be substituted or unsubstituted. A cyclic group can contain one or more aryl groups, one or more non-aryl groups, or one or more aryl groups and one or more non-aryl groups.

The term "acyl" as used herein is represented by the formula —C(O)$Z^1$ where $Z^1$ can be a hydrogen, hydroxyl, alkoxy, alkyl, alkenyl, alkynyl, aryl, heteroaryl, cycloalkyl, cycloalkenyl, heterocycloalkyl, or heterocycloalkenyl group described above. As used herein, the term "acyl" can be used interchangeably with "carbonyl." Throughout this specification "C(O)" or "CO" is a short hand notation for C=O.

The term "acetal" as used herein is represented by the formula ($Z^1Z^2$)C(=O$Z^3$)(=O$Z^4$), where $Z^1$, $Z^2$, $Z^3$, and $Z^4$ can be, independently, a hydrogen, halogen, hydroxyl, alkyl, alkenyl, alkynyl, aryl, heteroaryl, cycloalkyl, cycloalkenyl, heterocycloalkyl, or heterocycloalkenyl group described above.

As used herein, the term "alkoxy" as used herein is an alkyl group bound through a single, terminal ether linkage; that is, an "alkoxy" group can be defined as to a group of the formula $Z^1$—O—, where $Z^1$ is unsubstituted or substituted alkyl as defined above. Unless otherwise specified, alkoxy groups wherein $Z^1$ is a $C_1$-$C_{24}$ (e.g., $C_1$-$C_{22}$, $C_1$-$C_{20}$, $C_1$-$C_{18}$, $C_1$-$C_{16}$, $C_1$-$C_{14}$, $C_1$-$C_{12}$, $C_1$-$C_{10}$, $C_1$-$C_8$, $C_1$-$C_6$, or $C_1$-$C_4$) alkyl group are intended. Examples include methoxy, ethoxy, propoxy, 1-methyl-ethoxy, butoxy, 1-methyl-propoxy, 2-methyl-propoxy, 1,1-dimethyl-ethoxy, pentoxy, 1-methyl-butyloxy, 2-methyl-butoxy, 3-methyl-butoxy, 2,2-di-methyl-propoxy, 1-ethyl-propoxy, hexoxy, 1,1-dimethyl-propoxy, 1,2-dimethyl-propoxy, 1-methyl-pentoxy, 2-methyl-pentoxy, 3-methyl-pentoxy, 4-methyl-penoxy, 1,1-dimethyl-butoxy, 1,2-dimethyl-butoxy, 1,3-dimethyl-butoxy, 2,2-dimethyl-butoxy, 2,3-dimethyl-butoxy, 3,3-dimethyl-butoxy, 1-ethyl-butoxy, 2-ethylbutoxy, 1,1,2-trimethyl-propoxy, 1,2,2-trimethyl-propoxy, 1-ethyl-1-methyl-propoxy, and 1-ethyl-2-methyl-propoxy.

The term "aldehyde" as used herein is represented by the formula —C(O)H. Throughout this specification "C(O)" is a short hand notation for C=O.

The terms "amine" or "amino" as used herein are represented by the formula —NZ$^1$Z$^2$Z$^3$, where Z$^1$, Z$^2$, and Z$^3$ can each be substitution group as described herein, such as hydrogen, an alkyl, alkenyl, alkynyl, aryl, heteroaryl, cycloalkyl, cycloalkenyl, heterocycloalkyl, or heterocycloalkenyl group described above.

The terms "amide" or "amido" as used herein are represented by the formula —C(O)NZ$^1$Z$^2$, where Z$^1$ and Z$^2$ can each be substitution group as described herein, such as hydrogen, an alkyl, alkenyl, alkynyl, aryl, heteroaryl, cycloalkyl, cycloalkenyl, heterocycloalkyl, or heterocycloalkenyl group described above.

The term "carboxylic acid" as used herein is represented by the formula —C(O)OH. A "carboxylate" or "carboxyl" group as used herein is represented by the formula —C(O)O$^-$.

The term "cyano" as used herein is represented by the formula —CN.

The term "ester" as used herein is represented by the formula —OC(O)Z$^1$ or —C(O)OZ$^1$, where Z$^1$ can be an alkyl, alkenyl, alkynyl, aryl, heteroaryl, cycloalkyl, cycloalkenyl, heterocycloalkyl, or heterocycloalkenyl group described above.

The term "ether" as used herein is represented by the formula Z$^1$OZ$^2$, where Z$^1$ and Z$^2$ can be, independently, an alkyl, alkenyl, alkynyl, aryl, heteroaryl, cycloalkyl, cycloalkenyl, heterocycloalkyl, or heterocycloalkenyl group described above.

The term "ketone" as used herein is represented by the formula Z$^1$C(O)Z$^2$, where Z$^1$ and Z$^2$ can be, independently, an alkyl, alkenyl, alkynyl, aryl, heteroaryl, cycloalkyl, cycloalkenyl, heterocycloalkyl, or heterocycloalkenyl group described above.

The term "halide" or "halogen" or "halo" as used herein refers to fluorine, chlorine, bromine, and iodine.

The term "hydroxyl" as used herein is represented by the formula —OH.

The term "nitro" as used herein is represented by the formula —NO$_2$.

The term "phosphonyl" is used herein to refer to the phospho-oxo group represented by the formula —P(O)(OZ$^1$)$_2$, where Z$^1$ can be hydrogen, an alkyl, alkenyl, alkynyl, aryl, heteroaryl, cycloalkyl, cycloalkenyl, heterocycloalkyl, or heterocycloalkenyl group described above.

The term "silyl" as used herein is represented by the formula —SiZ$^1$Z$^2$Z$^3$, where Z$^1$, Z$^2$, and Z$^3$ can be, independently, hydrogen, alkyl, alkoxy, alkenyl, alkynyl, aryl, heteroaryl, cycloalkyl, cycloalkenyl, heterocycloalkyl, or heterocycloalkenyl group described above.

The term "sulfonyl" or "sulfone" is used herein to refer to the sulfo-oxo group represented by the formula —S(O)$_2$Z$^1$, where Z$^1$ can be hydrogen, an alkyl, alkenyl, alkynyl, aryl, heteroaryl, cycloalkyl, cycloalkenyl, heterocycloalkyl, or heterocycloalkenyl group described above.

The term "sulfide" as used herein is comprises the formula —S—.

The term "thiol" as used herein is represented by the formula —SH.

"R$^1$," "R$^2$," "R$^3$," "R$^n$," etc., where n is some integer, as used herein can, independently, possess one or more of the groups listed above. For example, if R$^1$ is a straight chain alkyl group, one of the hydrogen atoms of the alkyl group can optionally be substituted with a hydroxyl group, an alkoxy group, an amine group, an alkyl group, a halide, and the like. Depending upon the groups that are selected, a first group can be incorporated within second group or, alternatively, the first group can be pendant (i.e., attached) to the second group. For example, with the phrase "an alkyl group comprising an amino group," the amino group can be incorporated within the backbone of the alkyl group. Alternatively, the amino group can be attached to the backbone of the alkyl group. The nature of the group(s) that is (are) selected will determine if the first group is embedded or attached to the second group.

Unless stated to the contrary, a formula with chemical bonds shown only as solid lines and not as wedges or dashed lines contemplates each possible stereoisomer or mixture of stereoisomer (e.g., each enantiomer, each diastereomer, each meso compound, a racemic mixture, or scalemic mixture).

Reference will now be made in detail to specific aspects of the disclosed materials, compounds, compositions, articles, and methods, examples of which are illustrated in the accompanying examples and figures.

Composite Electrodes and Methods of Making Thereof

Disclosed herein are methods of making composite electrodes, for example wherein the composite electrodes comprise a MoS$_2$ thin film and a nanostructured electrode. In some examples, the methods can comprise depositing a precursor solution onto a substrate, thereby forming a precursor electrode comprising a precursor layer disposed on the substrate.

The precursor solution comprises a precursor compound of formula I:

[Mo$_3$S$_y$(S$_2$CNR$_2$)$_z$]X$_{4-z}$  I wherein
y is 4 or 7;
z is 3 or 4, with the proviso that when y is 7, z is 3;
R is a substituted or unsubstituted C$_1$-C$_{15}$ alkyl group, a substituted or unsubstituted C$_2$-C$_{15}$ alkenyl group, a substituted or unsubstituted C$_2$-C$_{15}$ alkynyl group, or a substituted or unsubstituted C$_3$-C$_{20}$ aryl group;
X is a halide anion, a tetrafluoroborate anion, or a hexafluorophosphate anion.

In some examples of Formula I, X is a halide anion. In some examples of Formula I, X is an iodine anion. In some examples of Formula I, X is a tetrafluoroborate anion or a hexafluorophosphate anion. In some examples of Formula I, R is a substituted or unsubstituted C$_1$-C$_4$ alkyl. In some examples of Formula I, R is an unsubstituted C$_1$-C$_4$ alkyl. In some examples of Formula I, is ethyl. In some examples of Formula I, R is a substituted or unsubstituted C$_{10}$-C$_{15}$ aryl. In some examples of Formula I, R is a substituted C$_{10}$-C$_{15}$ aryl. In some examples of Formula I, R is 3,5-di-tert-butylbenzyl.

In some examples of Formula I, z can be 3 and y can be 7 and the compounds can be of Formula A:

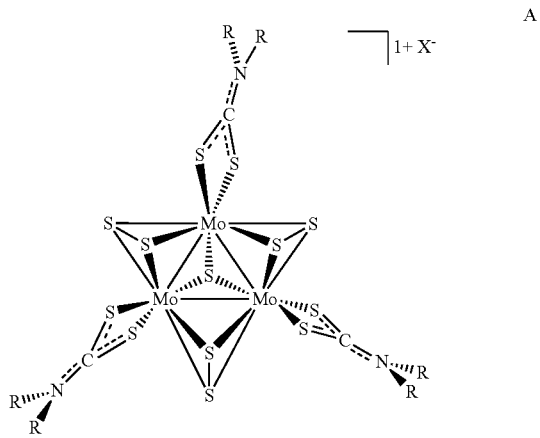

wherein the dotted lines between S, C, and N represent single or double bonds, as valence permits.

In some examples of Formula A, X is a halide anion. In some examples of Formula A, X is an iodine anion. In some examples of Formula A, X is a tetrafluoroborate anion or a hexafluorophosphate anion. In some examples of Formula A, R is a substituted or unsubstituted $C_1$-$C_4$ alkyl. In some examples of Formula A, R is an unsubstituted $C_1$-$C_4$ alkyl. In some examples of Formula A, is ethyl. In some examples of Formula A, R is a substituted or unsubstituted $C_{10}$-$C_{15}$ aryl. In some examples of Formula A, R is a substituted $C_{10}$-$C_{15}$ aryl. In some examples of Formula A, R is 3,5-di-tert-butylbenzyl.

In some examples of Formula I, z can be 3 and y can be 4 and the compounds can be of Formula B:

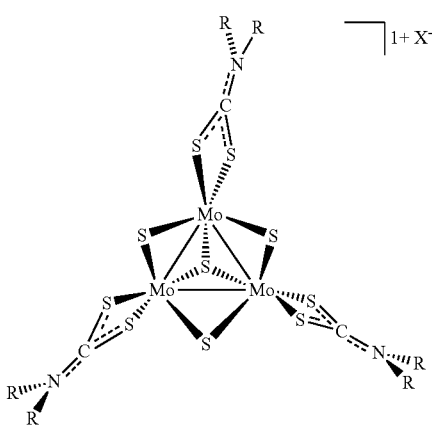

B wherein the dotted lines between S, C, and N represent single or double bonds, as valence permits.

In some examples of Formula B, X is a halide anion. In some examples of Formula B, X is an iodine anion. In some examples of Formula B, X is a tetrafluoroborate anion or a hexafluorophosphate anion. In some examples of Formula B, R is a substituted or unsubstituted $C_1$-$C_4$ alkyl. In some examples of Formula B, R is an unsubstituted $C_1$-$C_4$ alkyl. In some examples of Formula B, is ethyl. In some examples of Formula B, R is a substituted or unsubstituted $C_{10}$-$C_{15}$ aryl. In some examples of Formula B, R is a substituted $C_{10}$-$C_{15}$ aryl. In some examples of Formula B, R is 3,5-di-tert-butylbenzyl.

In some examples of Formula I, z can be 4 and y can be 4 and the compounds can be for Formula C:

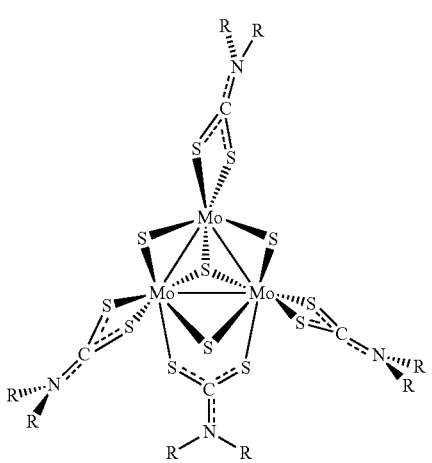

C wherein the dotted lines between S and C, and C and N represent single or double bonds, as valence permits.

In some examples of Formula C, R is a substituted or unsubstituted $C_1$-$C_4$ alkyl. In some examples of Formula C, R is an unsubstituted $C_1$-$C_4$ alkyl. In some examples of Formula C, is ethyl. In some examples of Formula C, R is a substituted or unsubstituted $C_{10}$-$C_{15}$ aryl. In some examples of Formula C, R is a substituted $C_{10}$-$C_{15}$ aryl. In some examples of Formula C, R is 3,5-di-tert-butylbenzyl.

The concentration of the precursor compound in the precursor solution can, for example, be 10 nanoMolar (nM) or more (e.g., 20 nM or more, 30 nM or more, 40 nM or more, 50 nM or more, 100 nM or more, 150 nM or more, 200 nM or more, 250 nM or more, 300 nM or more, 400 nM or more, 500 nM or more, 750 nM or more, 1 microMolar (μM) or more, 2 μM or more, 3 μM or more, 4 μM or more, 5 μM or more, 10 μM or more, 15 μM or more, 20 μM or more, 30 μM or more, 40 μM or more, 50 μM or more, 100 μM or more, 150 μM or more, 200 μM or more, 250 μM or more, 300 μM or more, 400 μM or more, 500 μM or more, 750 μM or more, 1 milliMolar (mM) or more, 2 mM or more, 3 mM or more, 4 mM or more, 5 mM or more, 10 mM or more, 15 mM or more, or 20 mM or more). In some examples, the concentration of the precursor compound in the precursor solution can be 50 milliMolar (mM) or less (e.g., 40 mM or less, 30 mM or less, 20 mM or less, 15 mM or less, 10 mM or less, 5 mM or less, 4 mM or less, 3 mM or less, 2 mM or less, 1 mM or less, 750 μM or less, 500 μM or less, 400 μM or less, 300 μM or less, 250 μM or less, 200 μM or less, 150 μM or less, 100 μM or less, 50 μM or less, 40 μM or less, 30 μM or less, 20 μM or less, 15 μM or less, 10 μM or less, 5 μM or less, 4 μM or less, 3 μM or less, 2 μM or less, 1 μM or less, 750 nM or less, 500 nM or less, 400 nM or less, 300 nM or less, 250 nM or less, 200 nM or less, 150 nM or less, 100 nM or less, 50 nM or less, 40 nM or less, 30 nM or less, 20 nM or less, 15 nM or less, 10 nM or less, or 5 nM or less).

The concentration of the precursor compound in the precursor solution can range from any of the minimum values described above to any of the maximum values described above. For example, the concentration of the precursor compound can be from 10 nM to 50 mM (e.g., from 10 nM to 1 μM, from 1 μM to 50 mM, from 10 nM to 100 nM, from 100 nM to 500 nM, from 500 nM to 1 μM, from 1 μM to 10 μM, from 10 μM to 100 μM, from 100 μM to 500 μM, from 500 μM to 1 mM, from 1 mM to 10 mM, from 10 mM to 50 mM, from 250 μM to 5 mM, or from 2 mM to 3 mM).

In some examples, the precursor solution can further comprise a solvent. Examples of solvents include, but are not limited to, tetrahydrofuran (THF), dimethylformamide (DMF), dichloromethane ($CH_2Cl_2$), ethylene glycol, ethanol, methanol, water, acetonitrile, chloroform, toluene, methyl acetate, ethyl acetate, and combinations thereof.

The precursor solution can, for example, be deposited onto the substrate by spin coating, spray coating, physical vapor deposition (e.g., sputtering, evaporation, etc.), chemical vapor deposition, or a combination thereof. In some examples, the precursor solution is deposited onto the substrate by spin coating and/or spray coating.

The substrate can, for example, comprise a semiconductor substrate and/or a conductive substrate. In some examples, the substrate can comprise a semiconductor substrate comprising a semiconductor selected from the group consisting of $TiO_2$, $Cu_2O$, $CuFeO_2$, Si, InGaN, InGaP, InP, and combinations thereof. In some examples, the semiconductor comprises $Cu_2O$. In some examples, the substrate can comprise a conductive substrate comprising Cu, Ag, Au, Fe, Ti, Al, Pt, C, indium doped tin oxide (ITO), fluorine doped tin oxide (FTO), or a combination thereof. In some examples, the conductive substrate comprises FTO.

The substrate can, in some examples, comprise a layer comprising a semiconductor disposed on a conductive substrate, wherein the semiconductor can be selected from the group consisting of $TiO_2$, $Cu_2O$, $CuFeO_2$, Si, InGaN, InGaP, InP, and combinations thereof. In some examples, the methods can further comprise forming the substrate by electrodepositing the semiconductor layer onto the conductive substrate.

In some examples, the semiconductor can comprise a plurality of particles. The plurality of particles can have an average particle size. "Average particle size" and "mean particle size" are used interchangeably herein, and generally refer to the statistical mean particle size of the particles in a population of particles. For example, the average particle size for a plurality of particles with a substantially spherical shape can comprise the average diameter of the plurality of particles. For a particle with a substantially spherical shape, the diameter of a particle can refer, for example, to the hydrodynamic diameter. As used herein, the hydrodynamic diameter of a particle can refer to the largest linear distance between two points on the surface of the particle. For an anisotropic particle, the average particle size can refer to, for example, the average maximum dimension of the particle (e.g., the length of a rod shaped particle, the diagonal of a cube shape particle, the bisector of a triangular shaped particle, etc.) For an anisotropic particle, the average particle size can refer to, for example, the hydrodynamic size of the particle. Mean particle size can be measured using methods known in the art, such as evaluation by scanning electron microscopy, transmission electron microscopy, and/or dynamic light scattering.

The semiconductor can comprise a plurality of particles having an average particle size of 5 nanometers (nm) or more (e.g., 6 nm or more, 7 nm or more, 8 nm or more, 9 nm or more, 10 nm or more, 15 nm or more, 20 nm or more, 25 nm or more, 30 nm or more, 35 nm or more, 40 nm or more, 45 nm or more, 50 nm or more, 60 nm or more, 70 nm or more, 80 nm or more, 90 nm or more, 100 nm or more, 150 nm or more, 200 nm or more, 250 nm or more, 300 nm or more, 350 nm or more, 400 nm or more, 450 nm or more, 500 nm or more, 600 nm or more, 700 nm or more, 800 nm or more, 900 nm or more, 1 micrometer (μm) or more, 2 μm or more, 3 μm or more, 4 μm or more, or 5 μm or more). In some examples, the plurality of particles can have an average particle size of 10 micrometers (μm) or less (e.g., 9 μm or less, 8 μm or less, 7 μm or less, 6 μm or less, 5 μm or less, 4 μm or less, 3 μm or less, 2 μm or less, 1 μm or less, 900 nm or less, 800 nm or less, 700 nm or less, 600 nm or less, 500 nm or less, 450 nm or less, 400 nm or less, 350 nm or less, 300 nm or less, 250 nm or less, 200 nm or less, 150 nm or less, 100 nm or less, 90 nm or less, 80 nm or less, 70 nm or less, 60 nm or less, 50 nm or less, 45 nm or less, 40 nm or less, 35 nm or less, 30 nm or less, 25 nm or less, 20 nm or less, 15 nm or less, or 10 nm or less).

The average particle size of the plurality of particles can range from any of the minimum values described above to any of the maximum values described above. For example, the plurality of particles can have an average particle size of from 5 nm to 10 μm (e.g., from 5 nm to 500 nm, from 500 nm to 10 μm, from 5 nm to 100 nm, from 100 nm to 500 nm, from 500 nm to 1 μm, from 1 μm to 10 μm, from 50 nm to 1 μm, or from 1 μm to 2 μm).

In some examples, the plurality of particles can be substantially monodisperse. "Monodisperse" and "homogeneous size distribution," as used herein, and generally describe a population of particles where all of the particles are the same or nearly the same size. As used herein, a monodisperse distribution refers to particle distributions in which 80% of the distribution (e.g., 85% of the distribution, 90% of the distribution, or 95% of the distribution) lies within 25% of the mean particle size (e.g., within 20% of the mean particle size, within 15% of the mean particle size, within 10% of the mean particle size, or within 5% of the mean particle size).

The plurality of particles can comprise particles of any shape (e.g., a sphere, a rod, a quadrilateral, an ellipse, a triangle, a polygon, etc.). In some examples, the plurality of particles can have an isotropic shape. In some examples, the plurality of particles are substantially spherical.

In some examples, the substrate can comprise a layer of a semiconductor wherein the semiconductor layer has an average thickness of 5 nm or more (e.g., 6 nm or more, 7 nm or more, 8 nm or more, 9 nm or more, 10 nm or more, 15 nm or more, 20 nm or more, 25 nm or more, 30 nm or more, 35 nm or more, 40 nm or more, 45 nm or more, 50 nm or more, 60 nm or more, 70 nm or more, 80 nm or more, 90 nm or more, 100 nm or more, 150 nm or more, 200 nm or more, 250 nm or more, 300 nm or more, 350 nm or more, 400 nm or more, 450 nm or more, 500 nm or more, 600 nm or more, 700 nm or more, 800 nm or more, 900 nm or more, 1 micrometer (μm) or more, 2 μm or more, 3 μm or more, 4 μm or more, or 5 μm or more). In some examples, the semiconductor layer can have an average thickness of 10 micrometers (μm) or less (e.g., 9 μm or less, 8 μm or less, 7 μm or less, 6 μm or less, 5 μm or less, 4 μm or less, 3 μm or less, 2 μm or less, 1 μm or less, 900 nm or less, 800 nm or less, 700 nm or less, 600 nm or less, 500 nm or less, 450 nm or less, 400 nm or less, 350 nm or less, 300 nm or less, 250 nm or less, 200 nm or less, 150 nm or less, 100 nm or less, 90 nm or less, 80 nm or less, 70 nm or less, 60 nm or less, 50 nm or less, 45 nm or less, 40 nm or less, 35 nm or less, 30 nm or less, 25 nm or less, 20 nm or less, 15 nm or less, or 10 nm or less).

The average thickness of the semiconductor layer can range from any of the minimum values described above to any of the maximum values described above. For example, the semiconductor layer can have an average thickness of from 5 nm to 10 μm (e.g., from 5 nm to 500 nm, from 500 nm to 10 μm, from 5 nm to 100 nm, from 100 nm to 500 nm, from 500 nm to 1 μm, from 1 μm to 10 μm, from 50 nm to 1 μm, or from 1 μm to 2 μm). The average thickness of the semiconductor layer can be measured using methods known in the art, such as evaluation by scanning electron microscopy, transmission electron microscopy, surface profilometry, X-ray reflectometry, polarized-light microscopy (ellipsometry), or a combination thereof.

The methods further comprise thermally annealing the precursor electrode, thereby forming a composite electrode comprising a $MoS_2$ layer disposed on the substrate. Thermally annealing the precursor electrode can comprise contacting the precursor electrode with an annealing gas at an annealing temperature. In some examples, the annealing gas can comprise an inert gas. In some examples, the annealing gas can comprise $N_2$.

The annealing temperature can, for example, be 50° C. or more (e.g., 75° C. or more, 100° C. or more, 125° C. or more, 150° C. or more, 175° C. or more, 200° C. or more, 225° C. or more, 250° C. or more, 275° C. or more, 300° C. or more, 325° C. or more, 350° C. or more, 375° C. or more, 400° C. or more, 425° C. or more, 450° C. or more, 475° C. or more, 500° C. or more, 525° C. or more, or 550° C. or more). In some examples, the annealing temperature can be 600° C. or less (e.g., 575° C. or less, 550° C. or less, 525° C. or less, 500° C. or less, 475° C. or less, 450° C. or less, 425° C. or less, 400° C. or less, 375° C. or less, 350° C. or less, 325° C. or less, 300° C. or less, 275° C. or less, 250° C. or less, 225° C. or less, 200° C. or less, 175° C. or less, 150° C. or less, 125° C. or less, or 100° C. or less). The annealing temperature can range from any of the minimum values described above to any of the maximum values described above. For example, the annealing temperature can be from 50° C. to 600° C. (e.g., from 50° C. to 325° C., from 325° C. to 600° C., from 50° C. to 200° C., from 200° C. to 400° C., from 400° C. to 600° C., from 200° C. to 600° C., from 300° C. to 600° C., from 350° C. to 500° C., from 400° C. to 500° C., from 350° C. to 450° C., or 425° C. to 475° C.).

The precursor electrode can, for example, be thermally annealed for an amount of time of 10 seconds or more (e.g., 15 seconds or more, 20 seconds or more, 25 seconds or more, 30 seconds or more, 40 seconds or more, 50 seconds or more, 1 minute or more, 2 minutes or more, 3 minutes or more, 4 minutes or more, 5 minutes or more, 10 minutes or more, 15 minutes or more, 20 minutes or more, 25 minutes or more, 30 minutes or more, 45 minutes or more, 1 hour or more, 2 hours or more, 3 hours or more, 4 hours or more, 5 hours or more, 6 hours or more, 7 hours or more, 8 hours or more, or 9 hours or more). In some examples, the precursor electrode can be thermally annealed for 12 hours or less (e.g., 11 hours or less, 10 hours or less, 9 hours or less, 8 hours or less, 7 hours or less, 6 hours or less, 5 hours or less, 4 hours or less, 3 hours or less, 2 hours or less, 1 hour or less, 45 minutes or less, 30 minutes or less, 25 minutes or less, 20 minutes or less, 15 minutes or less, 10 minutes or less, 5 minutes or less, 4 minutes or less, 3 minutes or less, 2 minutes or less, 1 minute or less, 50 seconds or less, 40 seconds or less, or 30 seconds or less). The amount of time the precursor electrode is thermally annealed can range from any of the minimum values described above to any of the maximum values described above. For example, the precursor electrode can be thermally annealed for an amount of time from 10 seconds to 12 hours (e.g., from 10 seconds to 6 hours, from 6 hours to 12 hours, from 10 seconds to 1 minute, from 1 minute to 10 minutes, from 10 minutes to 30 minutes, from 30 minutes to 1 hour, from 1 hour to 3 hours, from 3 hours to 6 hours, from 6 hours to 9 hours, from 9 hours to 12 hours, or from 1 minute to 10 hours).

In some examples, the $MoS_2$ layer of the composite electrode can have an average thickness of 1 nm or more (e.g., 2 nm or more, 3 nm or more, 4 nm or more, 5 nm or more, 6 nm or more, 7 nm or more, 8 nm or more, 9 nm or more, 10 nm or more, 15 nm or more, 20 nm or more, 25 nm or more, 30 nm or more, 35 nm or more, 40 nm or more, 45 nm or more, 50 nm or more, 60 nm or more, 70 nm or more, 80 nm or more, 90 nm or more, 100 nm or more, 125 nm or more, or 150 nm or more). In some examples, the $MoS_2$ layer can have an average thickness of 200 nm or less (e.g., 175 nm or less, 150 nm or less, 125 nm or less, 100 nm or less, 90 nm or less, 80 nm or less, 70 nm or less, 60 nm or less, 50 nm or less, 45 nm or less, 40 nm or less, 35 nm or less, 30 nm or less, 25 nm or less, 20 nm or less, 15 nm or less, 10 nm or less, 9 nm or less, 8 nm or less, 7 nm or less, 6 nm or less, or 5 nm or less).

The average thickness of the $MoS_2$ layer can range from any of the minimum values described above to any of the maximum values described above. For example, the $MoS_2$ layer can have an average thickness of from 1 nm to 200 nm (e.g., from 1 nm to 100 nm, from 100 nm to 200 nm, from 1 nm to 50 nm, from 50 nm to 100 nm, from 100 nm to 150 nm, from 150 nm to 200 nm, from 1 nm to 150 nm, from 5 nm to 100 nm, from 10 nm to 50 nm, from 20 nm to 40 nm, from 30 nm to 40 nm, or from 25 nm to 35 nm). The average thickness of the $MoS_2$ layer can be measured using methods known in the art, such as evaluation by scanning electron microscopy, transmission electron microscopy, surface profilometry, X-ray reflectometry, polarized-light microscopy (ellipsometry), or a combination thereof. The desired thickness of the $MoS_2$ layer can, for example, be selected based on the concentration of the precursor compound in the precursor solution, the deposition conditions, the annealing conditions, or a combination thereof.

Also disclosed herein are the composite electrodes made by the methods described herein. The composite electrode can, for example, have a photocurrent density of 2.0 mA cm$^{-2}$ or more at 0 Volts (V) vs. a reversible hydrogen electrode (RHE) (e.g., 2.5 mA cm$^{-2}$ or more, 3.0 mA cm$^{-2}$ or more, 3.5 mA cm$^{-2}$ or more, 4.0 mA cm$^{-2}$ or more, 4.5 mA cm$^{-2}$ or more, 5.0 mA cm$^{-2}$ or more, 5.5 mA cm$^{-2}$ or more, 6.0 mA cm$^{-2}$ or more, 6.5 mA cm$^{-2}$ or more, 7.0 mA cm$^{-2}$ or more, 7.5 mA cm$^{-2}$ or more, 8.0 mA cm$^{-2}$ or more, 8.5 mA cm$^{-2}$ or more, 9.0 mA cm$^{-2}$ or more, 9.5 mA cm$^{-2}$ or more, 10.0 mA cm$^{-2}$ or more, 11.0 mA cm$^{-2}$ or more, 12.0 mA cm$^{-2}$ or more, 13.0 mA cm$^{-2}$ or more, 14.0 mA cm$^{-2}$ or more, 15.0 mA cm$^{-2}$ or more, 16.0 mA cm$^{-2}$ or more, or 17.0 mA cm$^{-2}$ or more). In some examples, the composite electrode can have a photocurrent density of 20 mA cm$^{-2}$ or less at 0 V vs. RHE (e.g., 19.0 mA cm$^{-2}$ or less, 18.0 mA cm$^{-2}$ or less, 17.0 mA cm$^{-2}$ or less, 16.0 mA cm$^{-2}$ or less, 15.0 mA cm$^{-2}$ or less, 14.0 mA cm$^{-2}$ or less, 13.0 mA cm$^{-2}$ or less, 12.0 mA cm$^{-2}$ or less, 11.0 mA cm$^{-2}$ or less, 10.0 mA cm$^{-2}$ or less, 9.5 mA cm$^{-2}$ or less, 9.0 mA cm$^{-2}$ or less, 8.5 mA cm$^{-2}$ or less, 8.0 mA cm$^{-2}$ or less, 7.5 mA cm$^{-2}$ or less, 7.0 mA cm$^{-2}$ or less, 6.5 mA cm$^{-2}$ or less, 6.0 mA cm$^{-2}$ or less, 5.5 mA cm$^{-2}$ or less, 5.0 mA cm$^{-2}$ or less, 4.5 mA cm$^{-2}$ or less, 4.0 mA cm$^{-2}$ or less, 3.5 mA cm$^{-2}$ or less, or 3.0 mA cm$^{-2}$ or less).

The photocurrent density of the composite electrode can range from any of the minimum values described above to any of the maximum values described above. For example, the composite electrode can have a photocurrent density of from 2.0 mA cm$^{-2}$ to 20.0 mA cm$^{-2}$ at 0 V vs. RHE (e.g., from 2.0 mA cm$^{-2}$ to 11.0 mA cm$^{-2}$, from 11.0 mA cm$^{-2}$ to 20.0 mA cm$^{-2}$, from 2.0 mA cm$^{-2}$ to 8.0 mA cm$^{-2}$, from 8.0 mA cm$^{-2}$ to 14.0 mA cm$^{-2}$, from 14.0 mA cm$^{-2}$ to 20.0 mA cm$^{-2}$, from 2.0 mA cm$^{-2}$ to 15.0 mA cm$^{-2}$, 2.0 mA cm$^{-2}$ to 10.0 mA cm$^{-2}$, or from 2.0 mA cm$^{-2}$ to 4.0 mA cm$^{-2}$).

The composite electrode can, for example, have a dark current onset potential of −0.9 V or less as measured against a saturated calomel electrode (SCE) (e.g., −0.96 V or less, −0.97 V or less, −0.98 V or less, −0.99 V or less, −1.00 V or less, −1.01 V or less, −1.02 V or less, −1.03 V or less, −1.04 V or less, −1.05 V or less, −1.06 V or less, −1.07 V or less, −1.08 V or less, −1.09 V or less, −1.10 V or less, −1.11 V or less, −1.12 V or less, −1.13 V or less, −1.14 V or less, −1.15 V or less, −1.16 V or less, or −1.17 V or less). In some examples, the composite electrode can have a dark current onset potential of −1.2 V or more vs. SCE (e.g., −1.19 V or more, −1.18 V or more, −1.17 V or more, −1.16 V or more, −1.15 V or more, −1.14 V or more, −1.13 V or more, −1.12 V or more, −1.11 V or more, −1.10 V or more, −1.09 V or more, −1.08 V or more, −1.07 V or more, −1.06 V or more, −1.05 V or more, −1.04 V or more, −1.03 V or more, −1.02 V or more, −1.01 V or more, −1.00 V or more, −0.99 V or more, −0.98 V or more, −0.97 V or more, −0.96 V or more, −0.95 V or more, or −0.94 V or more) The dark current onset potential of the composite electrode can range from any of the minimum values described above to any of the maximum values described above. For example, the composite electrode can have a dark current onset potential of from −0.9 V to −1.2 V vs. SCE (e.g., from −0.9 V to −1.05 V, from −1.05 V to −1.2 V, from −0.9 V to −1.0 V, from −1.0 V to −1.1 V, from −1.1 V to −1.2 V, or from −0.95 V to −1.15 V).

In some examples, the composite electrode can have a power efficiency of 1% or more (e.g., 1.25% or more, 1.5% or more, 1.75% or more, 2% or more, 2.25% or more, 2.5% or more, 2.75% or more, 3% or more, 3.25% or more, 3.5% or more, 3.75% or more, 4% or more, 4.25% or more, or 4.5% or more). In some examples, the composite electrode can have a power efficiency of 5% or less (e.g., 4.75% or less, 4.5% or less, 4.25% or less, 4% or less, 3.75% or less, 3.5% or less, 3.25% or less, 3% or less, 2.75% or less, 2.5% or less, 2.25% or less, 2% or less, 1.75% or less, or 1.5% or less). The power efficiency of the composite electrode can range from any of the minimum values described above to any of the maximum values described above. For example, the composite electrode can have a power efficiency of from 1% to 5% (e.g., from 1% to 3%, from 3% to 5%, from 1% to 2%, from 2% to 3%, from 3% to 4%, from 4% to 5%, or from 2% to 4%).

In some examples, the composite electrode can have a relatively better photo-stability in a near-neutral 0.5 M $Na_2SO_4$ electrolyte at a constant potential of −0.6 V vs. SCE. For example, the composite electrode can have a stability of 25% or more after 10 minutes in near-neutral electrolyte (e.g., 30% or more, 35% or more, 40% or more, 45% or more, 50% or more, 55% or more, 60% or more, 65% or more, 70% or more, 75% or more, 80% or more, 85% or more, 90% or more, 91% or more, 92% or more, 93% or more, 94% or more, 95% or more, 96% or more, 97% or more, 98% or more, or 99% or more).

Methods of Use

Also disclosed herein are methods of use of the composite electrodes described herein. For example, the composite electrodes can be used as an electrode in an electrolysis reaction, a photoelectrochemical reaction, a water splitting reaction, in a solar cell, in a charge storage device, or a combination thereof. In some examples, the composite electrodes can be used in various articles of manufacture including sensors, energy conversion devices (e.g., solar cells, fuel cells, photovoltaic cells), and combinations thereof.

Also described herein are electrolysis and photoelectrochemical cells comprising: a working electrode comprising any of the composite electrodes described herein in electrochemical contact with a liquid sample; and one or more additional electrodes in electrochemical contact with the liquid sample. In some examples, the liquid sample comprises water.

Also described herein are methods of use of the electrolysis and photoelectrochemical cells described herein. For example, the photoelectrochemical cells can be used for a water splitting reaction, such as solar water splitting.

EXAMPLES

The following examples are set forth below to illustrate the methods and results according to the disclosed subject matter. These examples are not intended to be inclusive of all aspects of the subject matter disclosed herein, but rather to illustrate representative methods and results. These examples are not intended to exclude equivalents and variations of the present invention which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of reaction conditions, e.g., component concentrations, temperatures, pressures and other reaction ranges and conditions that can be used to optimize the product purity and yield obtained from the described process. Only reasonable and routine experimentation will be required to optimize such process conditions.

Solar water splitting can be achieved via a photoelectrochemical cell comprised of a photoactive semiconductor/electrolyte junction, where the minority charge carriers (electrons for a p-type semiconductor) generated upon light absorption in the semiconductor are driven into the electrolyte by the electric field established at the junction to store energy as Hz. Cuprous oxide ($Cu_2O$) is among the attractive p-type semiconducting materials with a suitable band gap for sunlight absorption and 18% theoretical photoelectrochemical water splitting efficiency (Paracchino A et al. Nat. Mater. 2011, 10, 456-461). Because the valence band of $Cu_2O$ originates mainly from the more diffuse and less directional Cu d orbitals than O p orbitals, the effective mass of the hole is lower. As a result, $Cu_2O$ possesses excellent electrical properties such as a long carrier diffusion length (up to several micrometers) (Olsen L C et al. Solar Cells 1982, 7, 247-279) and high hole mobility (100 $cm^2$ $V^{-1}$ $s^{-1}$) (Musa A O et al. Sol. Energy Mater. Sol. Cells 1998, 51, 305-316), leading to efficient extraction of separated charge carriers from an electrochemical device containing $Cu_2O$. For example, $Cu_2O$ has been widely exploited as a hole transport layer in planar p-i-n junction perovskite solar cells leading to high conversion efficiencies (Chatterjee S et al. J. Phys. Chem. C 2016, 120, 1428-1437). $Cu_2O$ is a p-type semiconductor that can efficiently absorb visible light and has a high absorption coefficient due to its narrow-forbidden band. Additional merits such as low-cost, abundance, easy scale-up by a simple electrodeposition method, greater visible light absorptivity, and proper straddling of its energy bands for the water reduction and oxidation potential levels make $Cu_2O$ attractive for potential applications in solar energy conversion and photocatalysis, such as for a photocathode to achieve visible-light-driven proton reduction for $H_2$ evolution.

However, $Cu_2O$ photocathodes suffer from poor chemical stability and sluggish proton reduction for splitting water under sunlight. The use of $Cu_2O$ as a photocathode for water reduction is hindered by its poor stability in aqueous solutions because the redox potentials for the self-reduction of $Cu_2O$ to Cu and self-oxidation of $Cu_2O$ to CuO all lie within the bandgap of $Cu_2O$, which eventually limits its durability and energy conversion. Thus, there is a need to develop a methodology to improve its stability for solar water splitting. Ultrathin Al:ZnO plus a few nm layer of $TiO_2$ followed by $RuO_x$ or $MoS_2$ and Pt nanoparticles (NPs) have been used to coat the surface of electrodeposited $Cu_2O$ to reduce its decomposition, and achieve the photocurrents of up to −7 mA $cm^{-2}$ at 0 V vs. reversible hydrogen electrode (Paracchino A et al. Nat. Mater. 2011, 10, 456-461; Azevedo J et al. Energ. Environ. Sci. 2014, 7, 4044-4052; Morales-Guio C G et al. Nat. Commun. 2014, 5, 3059; Li C et al. Energ. Environ. Sci. 2015, 8, 1493-1500). The Pt nanoparticles are often used as catalyst in these studies for hydrogen evolution reactions (HER), but large-scale applications of expensive Pt in photoelectrochemical solar fuel devices are severely limited. Other researchers used Pt-free approaches to protect $Cu_2O$ by use of graphene oxide, porous $Cu_2MoS_4$ followed by NiO layer and NiFe layered double hydroxide structures (Dubale A A et al. *J. Mater. Chem. A* 2014, 2, 18383-18397; Yang C et al. *Nanoscale* 2014, 6, 6506-6510; Qi H et al. *Sci. Rep.* 2016, 6, 30882). These approaches have yielded photocurrent of −4.8 mA $cm^{-2}$ at 0 V vs. reversible hydrogen electrode.

Molybdenum sulfide ($MoS_2$) has shown good prospects as both a protection layer and an electrocatalyst for hydrogen evolution reaction because of its excellent stability and high electrocatalytic activity, which can serve as excellent alternative material for proton reduction. However, the current electrodeposition coating methods only provide an amorphous $MoS_2$ layer on AZO+$TiO_2$-covered $Cu_2O$, and Pt nanoparticles are still needed to realize a photocurrent of −2.7 mA $cm^{-2}$ at 0 V vs. reversible hydrogen electrode from 1 M $Na_2SO_4$ with 0.1 M $K_3PO_4$ (at pH=5) (Morales-Guio C G et al. *Nat. Commun.* 2014, 5, 3059). Thus, a strategy is still needed for depositing $MoS_2$ that does not demand a complex procedure involving layers of multiple oxides followed by decoration of expensive Pt nanoparticles.

Described herein are methods of synthesizing and coating $MoS_2$ from a soluble precursor compound $[Mo_3S_7(S_2CNEt_2)_3]I$ for catalytic proton reduction on the surface of cuprous oxide ($Cu_2O$) for solar water splitting. Coating the $MoS_2$ layer onto $Cu_2O$ can improve its stability and proton reduction efficiency. The $MoS_2$ coating on top of $Cu_2O$ is achieved by spin coating $[Mo_3S_7(S_2CNEt_2)_3]I$ combined with a thermal annealing method to obtain the desired stoichiometry. The $MoS_2$ films synthesized using this method show good prospects for use as both a protection layer and an electrocatalyst for hydrogen evolution reactions (HER) due to its excellent stability and high electrocatalytic activity. The proton reduction performance of spin-coated $MoS_2$/FTO electrodes were studied to determine the optimal synthesis conditions using various derivatives of $MoS_2$ precursors. The photoelectrochemical measurements demonstrate higher activity for 3-layered (<50 nm thick) $MoS_2$/$Cu_2O$ photocathode fabricated at 450° C. with a photocurrent on the order of 5 mA $cm^{-2}$ at −0.2 V vs. reversible hydrogen electrode. Additionally, the $MoS_2$ coating improves the dark current characteristics of the $Cu_2O$ photocathode. Thus, a thin crystalline $MoS_2$ coating not only protects the $Cu_2O$ from being reduced in the electrolyte but also enhances the catalytic activity to facilitate proton reduction.

FIG. 1 shows the molecular structure of $[Mo_3S_7(S_2CNEt_2)_3]I$ and a schematic of the solar water splitting system to generate hydrogen using $MoS_2$-modified $Cu_2O$ photocathode. With the improved photoelectrochemical water splitting configuration of $MoS_2/Cu_2O$, the photogenerated electrons can be effectively transported from the light-absorbing $Cu_2O$ to the catalytic sites of $MoS_2$, helping facilitate the reduction of protons to hydrogen while preventing corrosion of $Cu_2O$. Such synthetic and coating approaches for $MoS_2$ offer a solution for large-scale production of dual functional $MoS_2/Cu_2O$ photocathode for overall photoelectrochemical water splitting with solar energy.

Copper sulfate anhydrous ($CuSO_4$, 98%, ACROS), lactic acid ($C_3H_6O_3$, 85.0-90.0%, Alfa Aesar), sodium hydroxide (beads, VWR), sodium sulfate anhydrous ($Na_2SO_4$, 99%, Fisher Scientific), acetone, absolute ethanol, and ethanol, tetrahydrofuran (THF), etc. were used as-received without further purification. All the solutions were freshly made using high purity deionized water (Resistivity <18 MΩ·cm). Commercially available transparent conducting glass substrates such as tin-doped indium oxide (ITO), fluorine-doped tin oxide (FTO, 15-20 Ω·$cm^{-1}$) were used for photoelectrochemical study with sample size of 1.5 cm×1.5 cm.

Prior to electrodeposition, the FTO (and ITO) substrates were cleaned successively using detergent followed by acetone, ethanol and deionized water in an ultrasonic bath each for 10 min, and finally dried using a nitrogen gas stream. The substrates were then treated by UV-ozone for 15 min. Electrodeposition of $Cu_2O$ was carried out using a slightly modified method analogous to the one reported elsewhere (Golden T D et al. *Chem. Mater.* 1996, 8, 2499-2504). The electrolyte for electrodeposition was comprised of a lactate-stabilized solution consisting of 0.2 M $CuSO_4$ and 3.0 M lactic acid prepared using deionized water. A p-type electrodeposit of $Cu_2O$ was ensured by maintaining an alkaline electrolyte environment, which was adjusted to a pH of 11.0 using an appropriate amount of NaOH. The deposition was accomplished at room temperature using an electrochemical workstation CHI760C (CH Instruments, Inc., Austin, Tex.) in a three-electrode system with a glass substrate as a working electrode (~2 $cm^2$ deposition area), a graphite rod as a counter electrode, and a platinum coil as a quasi-reference electrode. $Cu_2O$ was deposited at −0.3 V vs. Pt with total charge of ~4.5 C for optimal film thickness (few μm).

The solvents employed for synthesis of the $MoS_2$ precursor derivatives were dried with a system of drying columns from the Glass Contour Company ($CH_2Cl_2$, hexanes), purchased in an ultra-dry grade (N,N-dimethylformamide), or simply used as received from commercial sources. Tetraethylthiuram disulfide was also used as supplied from a commercial vendor. Literature procedures were used in the preparations of $[NH_4]_2[Mo_3S_{13}]$ (Müller A et al. *Chem. Ber.* 1979, 112, 778-780) and $[Mo_3S_7(S_2CNEt_2)_3]I$ (Zimmermann H et al. *Inorg. Chem.* 1991, 30, 4336-4341). The related dimethyldithiocarbamate derivative, $[Mo_3S_7(S_2CNMe_2)_3]I$, was also prepared by the method of Hegetschweiler and coworkers (Zimmermann H et al. *Inorg. Chem.* 1991, 30, 4336-4341) but from $[Ph_4P]_2[Mo_3S_7Br_6]$ rather than $[Et_4N]_2[Mo_3S_7Br_6]$. The $[Bu_4N]^+$ salt of $[Mo_3S_{13}]^{2-}$ was prepared from $[NH_4]_2[Mo_3S_{13}]$ by base neutralization with $[Bu_4N][OH]$, as described by McDonald and coworkers (McDonald J W et al. *Inorg. Chim. Acta* 1983, 72, 205-210). To achieve $MoS_2$ coating on $Cu_2O$ films, first the precursor was dissolved in an appropriate solvent and spin-coated onto $Cu_2O$ films. The desired $MoS_2$ coating thickness was optimized by adjusting the precursor concentration as well as number of spin-coated layers.

The thermal behavior of as-synthesized $[Mo_3S_7(S_2CNEt_2)_3]I$ powder (a precursor for coating $MoS_2$ film) was examined using a simultaneous thermogravimetric analyzer on a SETARAM SETSYS evolution, which performed thermogravimetric analysis (TGA) and differential scanning calorimetry (DSC) simultaneously. The thermogravimetric analysis/differential scanning calorimetry measurements were performed by heating the powder in an $Al_2O_3$ crucible under flowing argon at a heating rate of 2° C. min' from room temperature to 600° C. The structural analysis of as-grown $Cu_2O$ and $N_2$-annealed $MoS_2$-coated $Cu_2O$ samples was performed using a Bruker D8 Discover X-ray diffractometer equipped with Co-Kα radiation source operated at 40 kV and 30 mA. The X-ray diffraction (XRD) patterns were recorded in the 2θ range of 20–100°. The phase identification was done using Bruker GADDS software with the help of a standard diffraction database (ICDD). The surface morphology and chemical composition of films were examined using a JEOL 700 scanning electron microscope (SEM) equipped with an X-ray energy dispersive spectrometer (EDS). High resolution transmission electron microscopy (HRTEM) images of $Cu_2O$ and $MoS_2$-coated $Cu_2O$ were acquired from a FEI TECNAI F20 transmission electron microscope. A TESCAN LYRA focus ion beam-field emission scanning electron microscope (FIB-FESEM) was used to image the surface topography of $MoS_2$ on FTO and to deposit platinum through a gas injection system for surface extraction/preparation of a transmission electron microscopy foil. The extracted wedge was thinned to a thickness of less than ~100 nm. The rotating ring disc electrode (RRDE), polarization and photocurrent measurements were performed using an electrochemical station CHI760C. The rotating ring disc electrode voltammograms were recorded on a rotating ring disc electrode configuration (ALS Co., Ltd, Japan) with a glassy carbon (GC) disc and Pt ring electrode. The geometric area of Pt ring was 0.75 $cm^2$ (inner diameter (ID)=0.5 cm and outer diameter (OD)=0.7 cm). The glassy carbon disc with a geometric area of 0.50 $cm^2$ was used as the substrate for deposition of $MoS_2$ catalyst. Prior to catalyst deposition, the rotating ring disc electrode was initially polished with a 0.3 μm alumina (Buehler) slurry on a Nylon pad and subsequently with 0.05 μm alumina slurry on a micro-cloth (CHI Instruments) and then cleaned with deionized water ultrasonically. All electrochemical as well as photoelectrochemical measurements were carried out at room temperatures in a three-electrode system consisting of photocathode as the working electrode, a Pt coil as the counter electrode and saturated calomel electrode (SCE, sat. KCl) as reference electrode. Unless otherwise specified, all potentials in this work are measured against the saturated calomel electrode or Ag/AgCl (sat. KCl) reference electrode and are reported versus reversible hydrogen electrode (RHE). The cyclic voltammetry polarization curves were recorded for proton reduction studies using $MoS_2$-coated glassy carbon or ITO electrodes in 0.5 M $H_2SO_4$ electrolyte at the scan rate of 50 mV $s^{-1}$. The polarization curves were all corrected for the iR contribution within the cell. The photoelectrochemical measurements of as-grown and $MoS_2$-coated $Cu_2O$ photocathodes were performed in 0.5 M $Na_2SO_4$ electrolyte. Prior to the photocurrent-potential (J-V) and incident photon-to-current conversion efficiency (IPCE) measurements, the electrolyte was bubbled with high-purity $N_2$ for 30 min to get rid of dissolved oxygen and thus eliminate the erroneous signals arising from oxygen reduction. A standard simulated 1 sun (intensity of 100 mW $cm^{-2}$) irradiation was provided with the help of a solar simulator using a 300 W xenon arc lamp (Oriel A M 1.5 filtered, Newport) light source. The J-V curves of photocathodes were recorded using linear sweep voltammetry (LSV) at a scan rate of 100 mV $s^{-1}$ under chopped light (light on/off cycle: 0.4 s) with front-side illumination. Incident photon-to-current conversion efficiency or action spectra were measured using a 300 W xenon lamp light source and a monochromator in the wavelength range of 400-700 nm. The photocathode was fixed inside a three-arm photoelectrochemical cell and illuminated from the substrate side (back-side) as well as the film side (front-side). The photocurrent responses at each wavelength were collected by measuring chronoamperometric i-t curve in a three-electrode configuration at −0.4 V vs. Ag/AgCl (~0.2 V vs. reversible hydrogen electrode) in 0.5 M $Na_2SO_4$ (pH=6.7). The power density of the monochromatic light was measured using a calibrated silicon photodiode (THOR-LABS, S110C) to determine the incident photon-to-current conversion efficiency values at each wavelength. The electrochemical impedance spectroscopy (EIS), and Mott-Schottky (MS) studies were performed using an electrochemical workstation (CHI 760c, CH Instruments) equipped with an electrochemical interface and impedance analyzer facility. The electrochemical impedance spectroscopy curves were recorded from 100 kHz to 0.1 Hz at the water reduction potential at −0.6 V vs. Ag/AgCl (0.0 V vs. reversible hydrogen electrode) under 1 sun illumination. A ZView program (Scribner Associates Inc.) was used to fit the electrochemical impedance spectroscopy data with the help of a suitable equivalent circuit model. The Mott-Schottky measurements were performed in the dark by sweeping a DC potential from −0.5 to 0.2 V vs. Ag/AgCl at an AC frequency of 1 kHz. The amplitude of AC signal was 10 mV for both electrochemical impedance spectroscopy and Mott-Schottky measurements.

Figure 2:
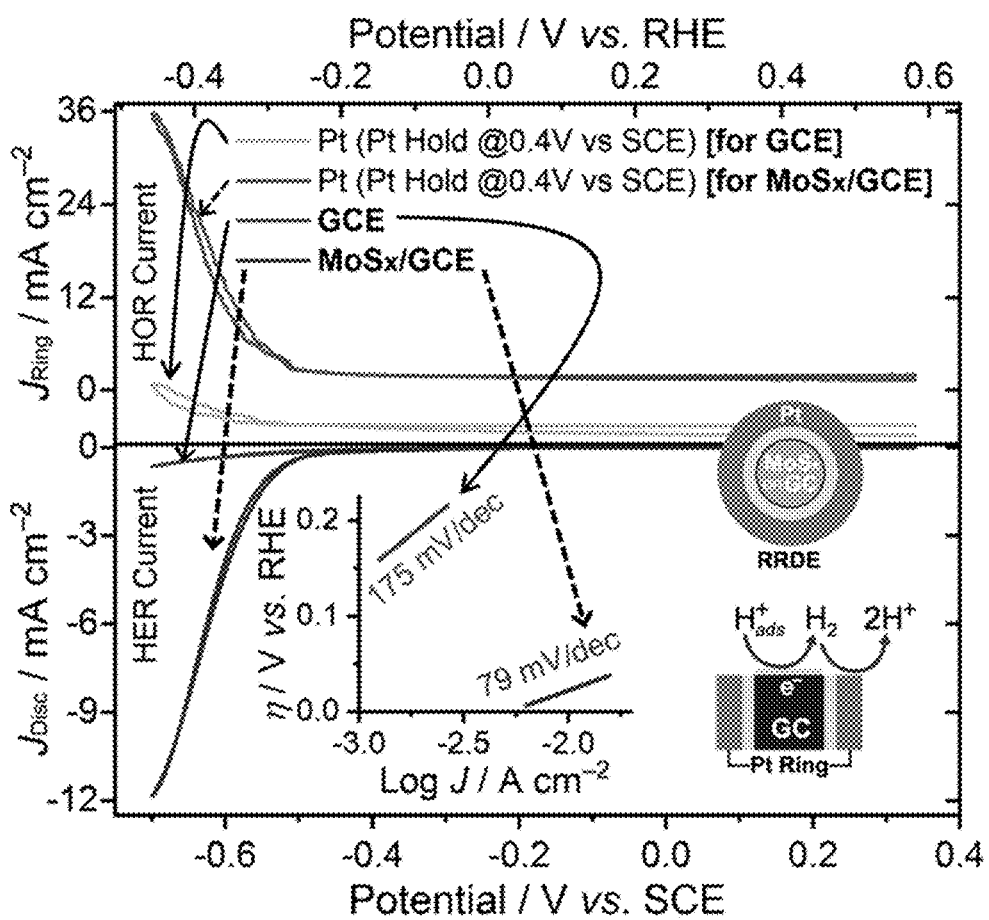
FIG. 2 is the rotating ring disc electrode (RRDE) response (at a rotation speed of 5000 rpm) recorded at 50 mV s$^{-1}$ scan rate in 0.5 M $H_2SO_4$ solution for both bare glassy carbon electrode (GCE) and 5.0 mM $MoS_2$/glassy carbon electrode; Inset shows the Tafel slope for each electrode.

To quickly gain insight into the hydrogen evolution reaction electrocatalytic activity of $MoS_2$, rotating ring-disc electrode (RRDE) voltammograms were carried out based on a rotating ring disc electrode configuration with a glassy carbon (GC) disc and Pt ring electrode. A $MoS_2$ electrocatalyst was prepared on glassy carbon by drop-casting and air-drying a microliter drop of 5 mM $MoS_2$ precursor solution from THF. FIG. 2 shows the polarization curves for hydrogen evolution reaction on glassy carbon and $MoS_2$-modified glassy carbon recorded at 5000 rpm in 0.5 M $H_2SO_4$ electrolyte. To ensure that the oxidation current originated from hydrogen oxidation, the ring potential was held constant at 0.4 V vs. saturated calomel electrode (0.65 V vs. reversible hydrogen electrode). As seen from FIG. 2, the rotating ring disc electrode response of $MoS_2$-modified glassy carbon electrode is remarkably higher than that of glassy carbon electrode. Inset of FIG. 2 shows the plot of overpotential (η) vs. reversible hydrogen electrode against logarithm of current density. Tafel slopes are derived from the polarization curves to gain insight into the hydrogen evolution reaction process. The corresponding Tafel slope of $MoS_2$/glassy carbon electrode, 79 mV $dec^{-1}$, is much lower than that of bare glassy carbon electrode (175 mV $dec^{-1}$), indicating that the introduction of spin-coated $MoS_2$ can deliver much more favorable reaction kinetics and provide a remarkably increased hydrogen evolution reaction rate (drive a large catalytic current density at relatively low overpotential).

Figure 3:
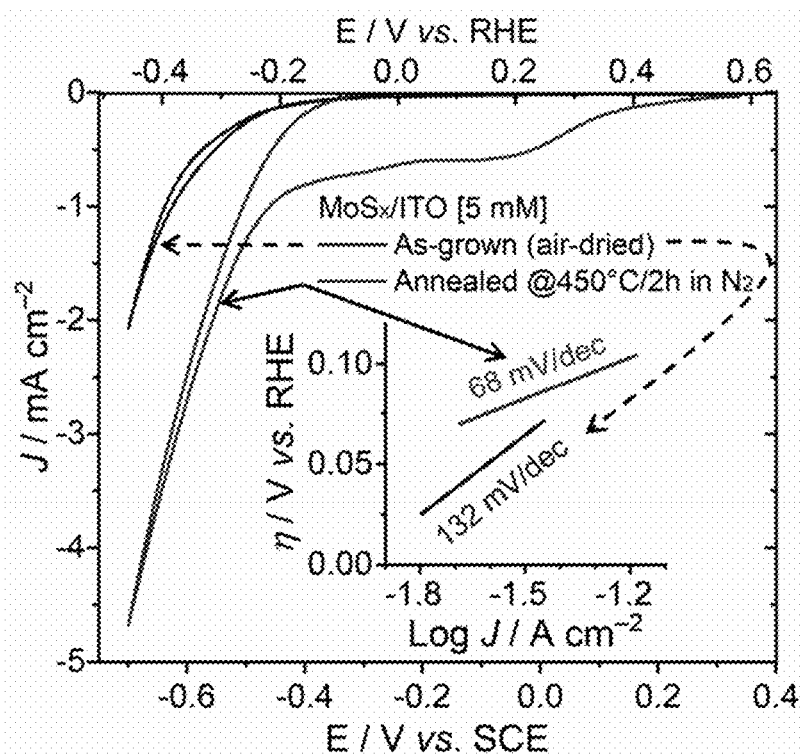
FIG. 3 is the polarization curves of as-grown and $N_2$-annealed $MoS_2$/ITO electrodes for proton reduction, recorded at 50 mV s$^{-1}$ scan rate in 0.5 M $H_2SO_4$ solution.

To further assess the electrocatalytic proton reduction activity, a 5 mM solution of $MoS_2$ in THF was spin-coated onto conducting ITO substrates. Electrocatalytic activity for proton reduction by $MoS_2$ catalyst before and after annealing at 450° C. in $N_2$ atmosphere was investigated by cyclic voltammetry for hydrogen evolution reaction in 0.5 M $H_2SO_4$ electrolyte. As shown in FIG. 3, $N_2$-annealed $MoS_2$ exhibits relatively higher electrocatalytic performance as an efficient hydrogen evolution reaction catalyst with a low onset potential, high catalytic current density and small Tafel slope (68 mV $dec^{-1}$) compared to as-grown $MoS_x$ on ITO electrode (132 mC $dec^{-1}$). This enhancement can be ascribed to the formation of crystalline $MoS_2$ with catalytically active sites.

Figure 4:
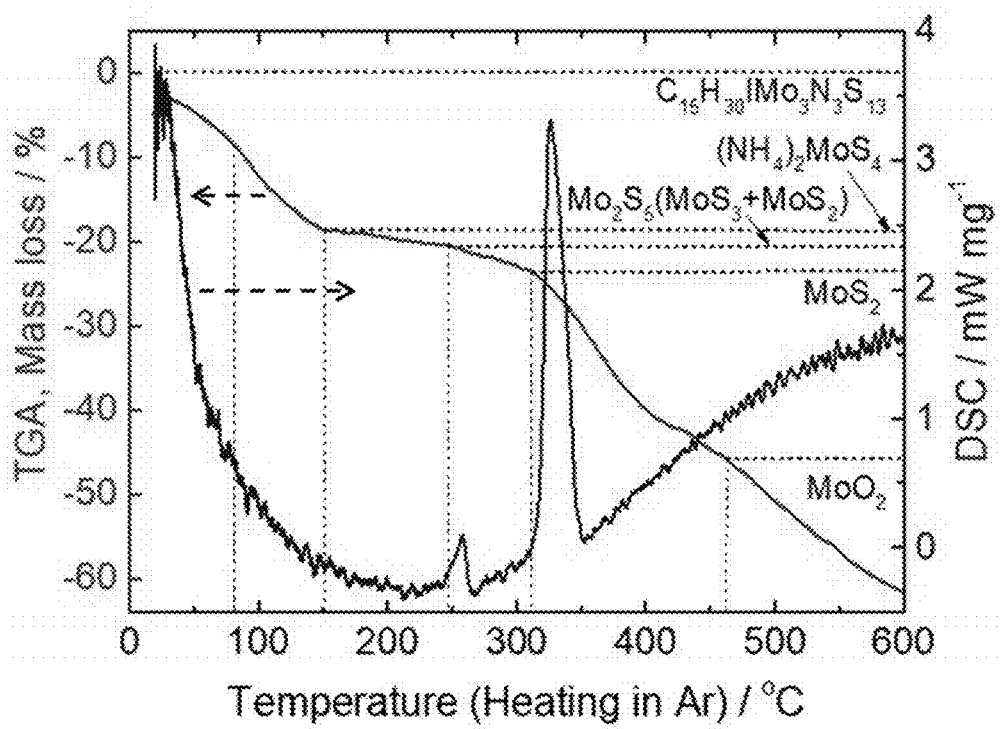
FIG. 4 is the thermogravimetric analysis/differential scanning calorimetry profiles of $MoS_2$ precursor ([$Mo_3S_7$($S_2CNMe_2$)$_3$]I) in Ar atmosphere.

The simultaneous thermogravimetric analysis/differential scanning calorimetry analysis of $[Mo_3S_7(S_2CNEt_2)_3]I$ in Ar environment was performed to observe the thermolysis of $[Mo_3S_7(S_2CNEt_2)_3]I$ and the subsequent crystallization behavior of $MoS_2$. FIG. 4 shows the thermogravimetric analysis/differential scanning calorimetry profiles of $[Mo_3S_7(S_2CNEt_2)_3]I$ under flowing Ar gas. The profiles suggest a series of reactions with continuous weight losses upon heating from room temperature to 600° C. Five decomposition steps can be identified from thermogravimetric analysis curve with mass loss ratios of 8.2%, 18.3%, 20.5%, 23.3%, and 45.8%, respectively. The first decomposition at around 80° C. arises from the dehydration of the starting precursor material, which caused 8.2% mass loss. The second in the range 80-150° C., causing an accumulated mass loss of 26.5% (8.2%+18.3%), suggests the formation of a $(NH_4)_2MoS_4$. For the third decomposition, a mixture of $MoS_3/MoS_2$ (in a ratio of 1:1) is probably formed in the temperature range of 150-245° C. leading to a total weight loss of 20.5%, which implies a transition from $(NH_4)_2MoS_4$ to $MoS_2$. In the temperature range of 245-310° C., the $MoS_2$ is formed at a mass loss of 23.3%. In the temperature 310-462° C., the crystalline transformation of $MoS_2$ occurs. However, with a mass loss of 45.8%, $MoS_2$ is converted into $MoO_2$ at higher temperatures, possibly due to residual oxygen present in the crucible. The presence of two distinct exothermic peaks at 258° C. and 325° C. also confirms the phase transformations from amorphous mixed ($MoS_3$+$MoS_2$) to crystalline $MoS_2$ material. Hence, the annealing temperature window of 350-450° C. is best suited to fabricate the crystalline $MoS_2$ phase.

Figure 5:
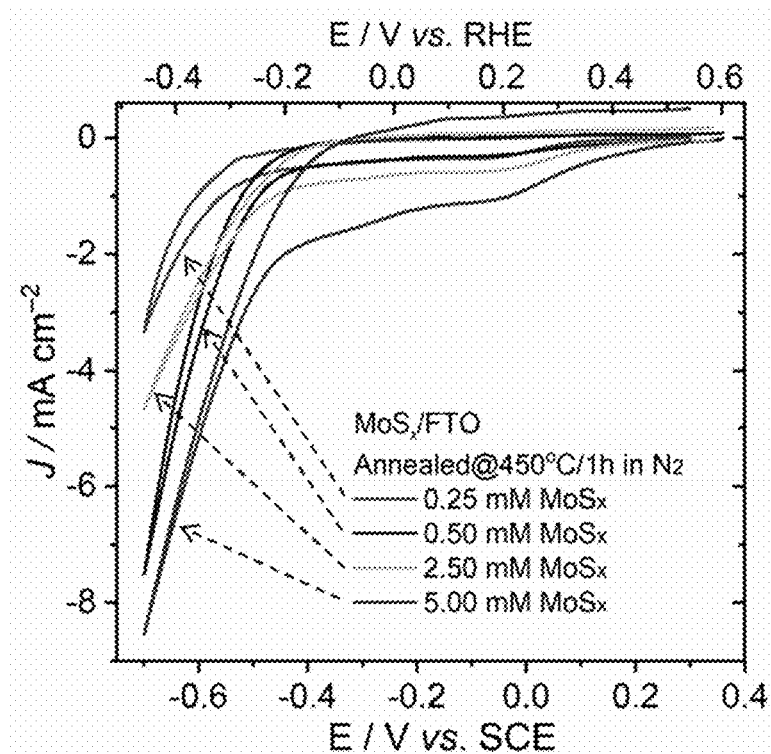
FIG. 5 shows the effect of $MoS_2$ film thickness on proton reduction current density of $MoS_2$/ITO electrodes.
Figure 6:
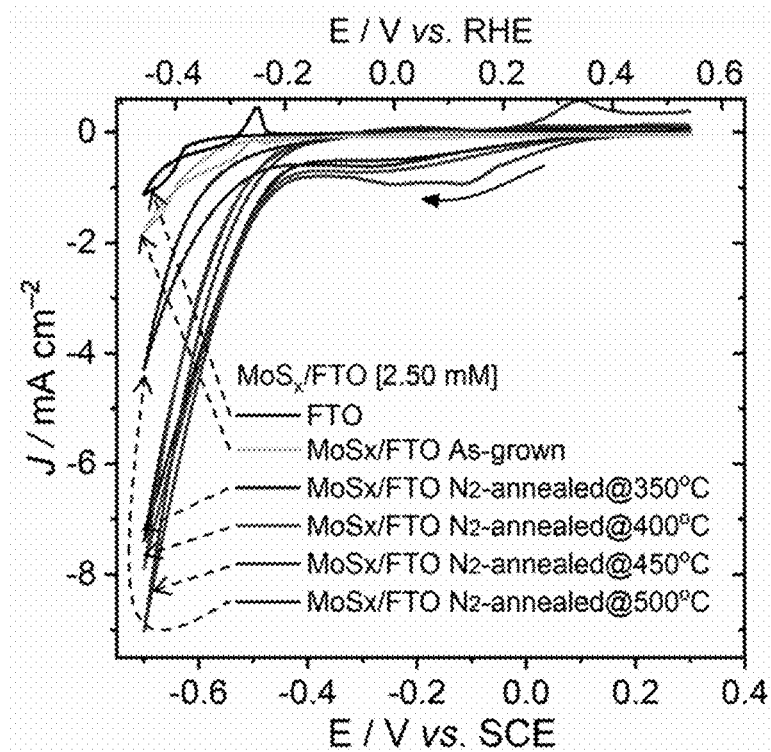
FIG. 6 shows the effect of $N_2$-annealing temperature on proton reduction current density of $MoS_2$/ITO electrodes.

FIG. 5 shows proton reduction hydrogen evolution reaction curves of $MoS_2$/FTO electrodes fabricated at 450° C. by spin-coating different concentrations of $[Mo_3S_7(S_2CNEt_2)_3]I$ precursor in THF. The precursor concentration was varied from 0.25 to 5.0 mM. The hydrogen evolution reaction curves suggest that a precursor concentration of 2.5 mM give optimum proton reduction performance. Additionally, to determine the appropriate temperature to fabricate active $MoS_2$ coating, the $N_2$-annealing temperature was varied from 350° C. to 500° C. at intervals of 50° C. by keeping a fixed precursor concentration of 2.5 mM (See FIG. 6). The annealing study suggests that a $MoS_2$/FTO electrodes fabricated at 450° C. gives optimum hydrogen evolution reaction performance.

Figure 7:
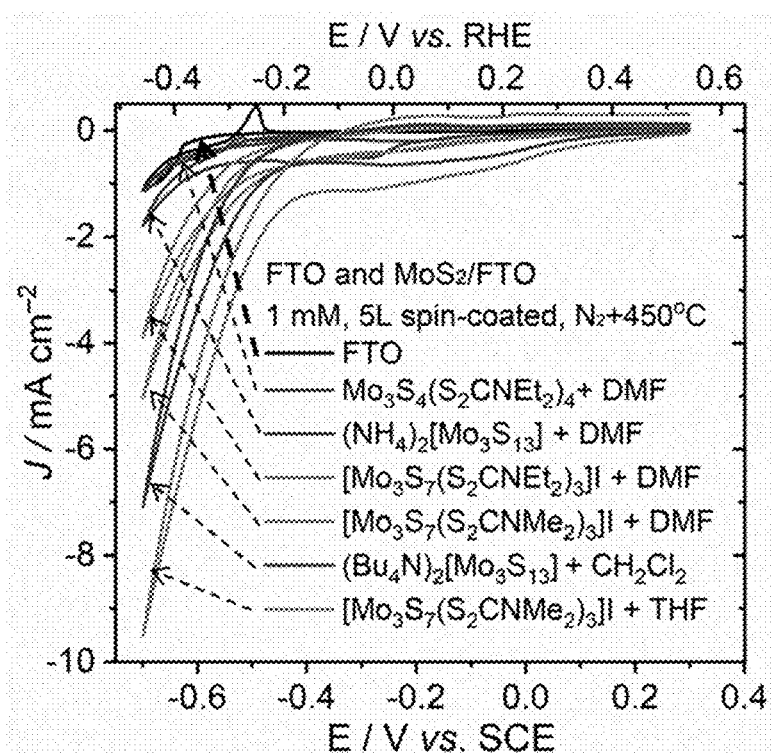
FIG. 7 is the proton reduction hydrogen evolution reaction curves for various derivatives of $MoS_2$.

The $[Mo_3S_7(S_2CNMe_2)_3]I$ and other derivatives of $MoS_2$ such as $[Mo_3S_7(S_2CNEt_2)_3]I$, $Mo_3S_4(S_2CNEt_2)_4$, $(NH_4)_2[Mo_3S_{13}]$, and $(Bu_4N)_2[Mo_3S_{13}]$ were also investigated to study the proton reduction. These precursors were dissolved in different solvents such as THF, DMF, or $CH_2Cl_2$, spin-coated onto conducting FTO glass substrates, and $N_2$-annealed at 450° C. for 1 h. Owing to their limited solubility, precursor concentrations of 1.0 mM were employed for all derivatives such that, for purposes of comparison, all $MoS_2$ films were prepared under a common set of conditions. The proton reduction hydrogen evolution reaction curves for all the derivatives are shown in FIG. 7. Among them, $[Mo_3S_7(S_2CNMe_2)_3]I$ prepared from THF exhibited the most promising hydrogen evolution reaction activity. Thus, $[Mo_3S_7(S_2CNMe_2)_3]I$ was chosen for further studies with $Cu_2O$ photocathodes.

Figure 8:
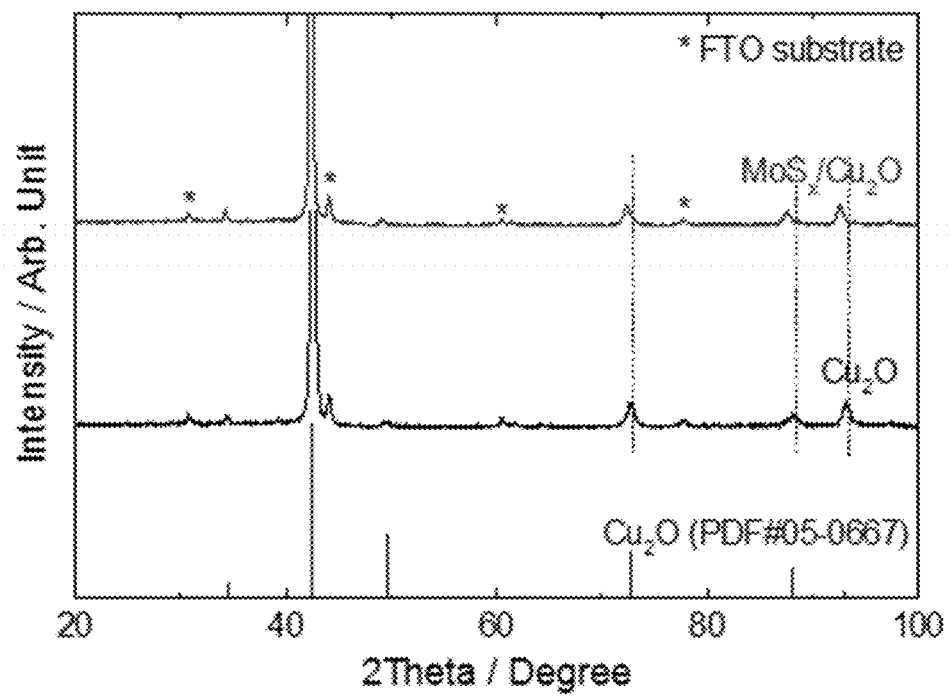
FIG. 8 is the X-ray diffraction patterns of as-grown $Cu_2O$/FTO and $N_2$-annealed $MoS_2/Cu_2O$/FTO electrodes.
Figure 9:
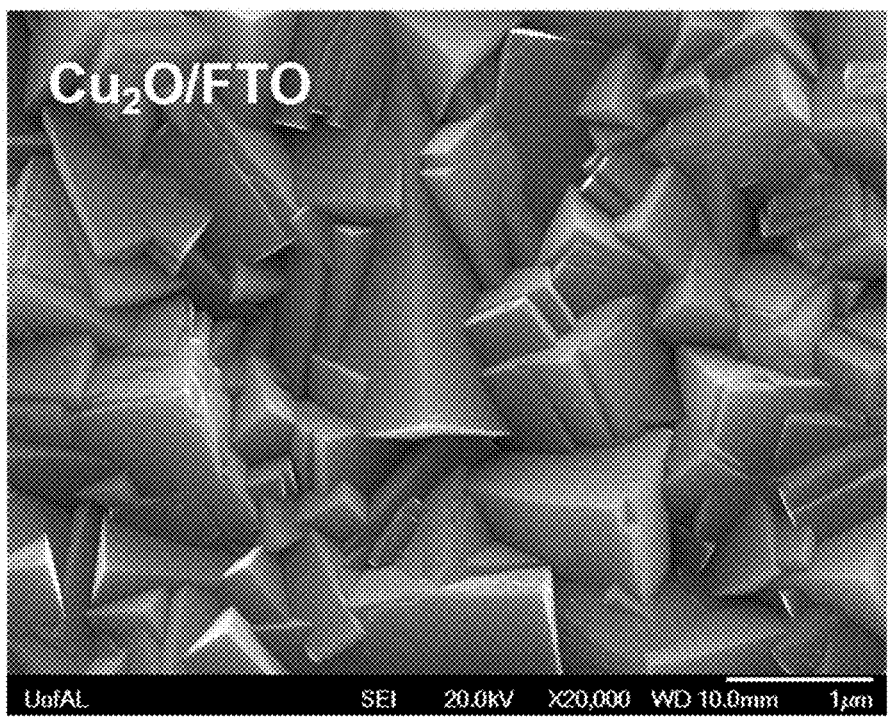
FIG. 9 is a surface scanning electron microscopy (SEM) image of as-grown $Cu_2O$.
Figure 10:
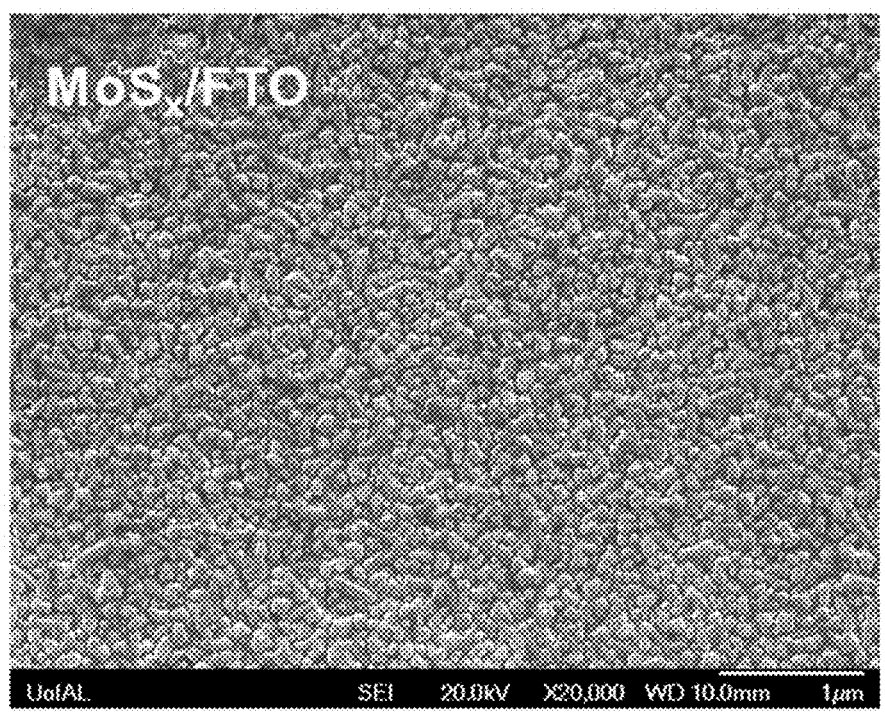
FIG. 10 is a surface scanning electron microscopy image of $MoS_2$ alone.
Figure 11:
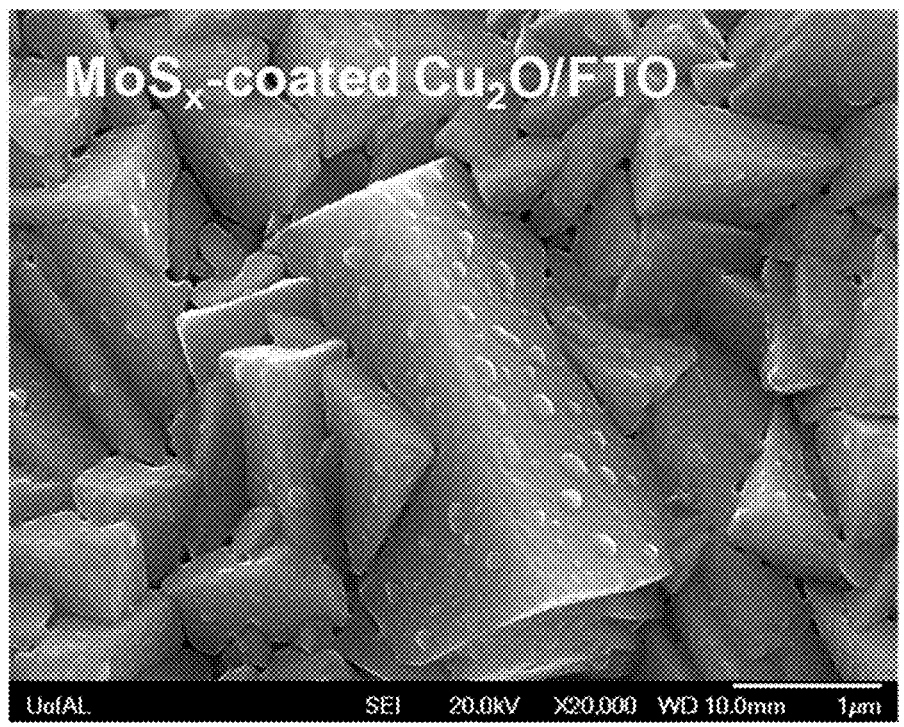
FIG. 11 is a surface scanning electron microscopy image of a $N_2$-annealed $MoS_2/Cu_2O$ electrode.
Figure 12:
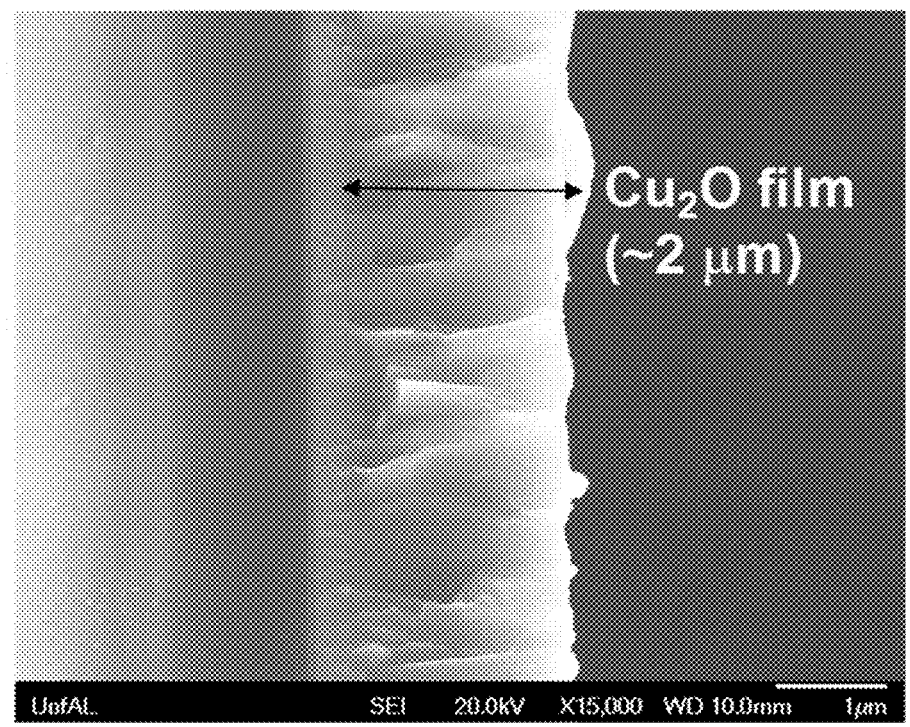
FIG. 12 is a cross-sectional scanning electron microscopy image of a $N_2$-annealed $MoS_2/Cu_2O$ electrode.
Figure 13:
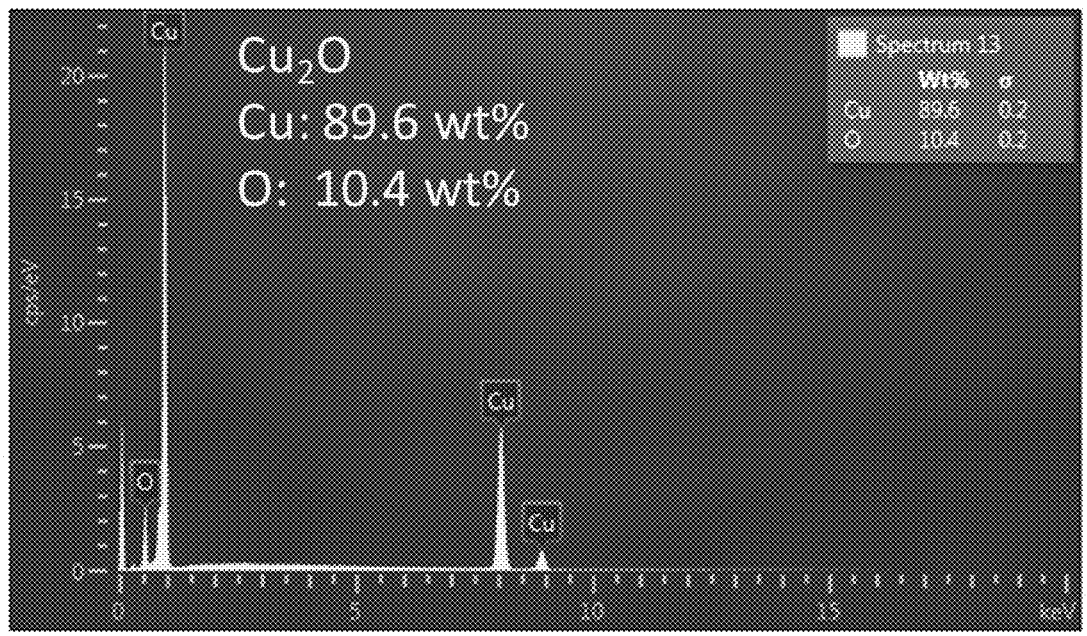
FIG. 13 is the X-ray energy dispersive (XRD) spectroscopic analysis of as-grown $Cu_2O$ (corresponding SEM image shown in FIG. 9).
Figure 14:
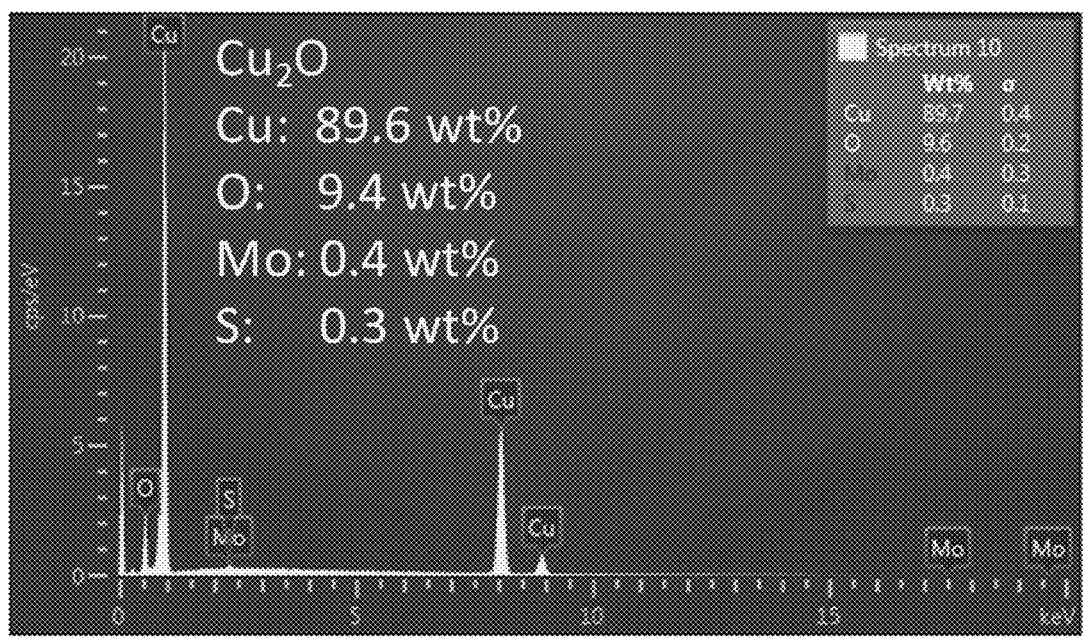
FIG. 14 is the X-ray energy dispersive (XRD) spectroscopic analysis of a $N_2$-annealed $MoS_2/Cu_2O$ electrode (corresponding SEM image shown in FIG. 11).

FIG. 8 shows the X-ray diffraction patterns of as-grown $Cu_2O$ and $N_2$-annealed $MoS_2$-coated $Cu_2O$ films. The as-grown $Cu_2O$ film shows the formation of phase-pure cubic $Cu_2O$ structure as evidenced from the close match of the observed diffraction peaks at 34.45°, 42.56°, 49.39°, 72.54°, 88° and 93.14° corresponding to the diffraction of (110), (111), (200), (220), (311) and (222) planes of $Cu_2O$ (ICDD PDF #05-0667). No discernible peaks of CuO or Cu are seen. The peaks marked by asterisks are due to contribution from the underlying FTO substrate. The X-ray diffraction of $N_2$-annealed $MoS_2$-coated $Cu_2O$ sample shows an identical pattern with no peaks of $MoS_2$. However, the diffraction peaks of $Cu_2O$ are shifted slightly towards lower diffraction angle. The strong contributions from $Cu_2O$ signals might have shadowed the contributions from a thin layer of $MoS_2$. Additionally, a larger shift in 2θ angle at higher angles suggests that there is reduction in the strain of the film. The two-dimensional $MoS_2$ is reportedly known to endure large strain (Yang L et al. Sci. Rep. 2014, 4, 5649; Rice C et al. Phys Rev B 2013, 87, 081307; Castellanos-Gomez A et al. Nano Lett. 2013, 13, 5361-5366). FIG. 9-FIG. 12 shows the representative scanning electron microscopy images of $Cu_2O$, $MoS_2$ and $MoS_2$-coated $Cu_2O$ films prepared on FTO. As one can see, the $Cu_2O$ film is comprised of continuously distributed polyhedral cuboidal-shaped grains ranging from 1 to 2 μm. The thin layer of $MoS_2$ on FTO shows tiny grains (<100 nm) with uniform coverage. The $N_2$-annealed $Cu_2O$ films shows cuboidal shaped grains covered with a thin layer of $MoS_2$. The thickness of the as-grown $Cu_2O$ film estimated from the cross-section scanning electron microscopy image is ~2 μm. The presence of $MoS_2$ was confirmed from the X-ray energy dispersive spectroscopic analysis (FIG. 13-FIG. 14).

Figure 15:
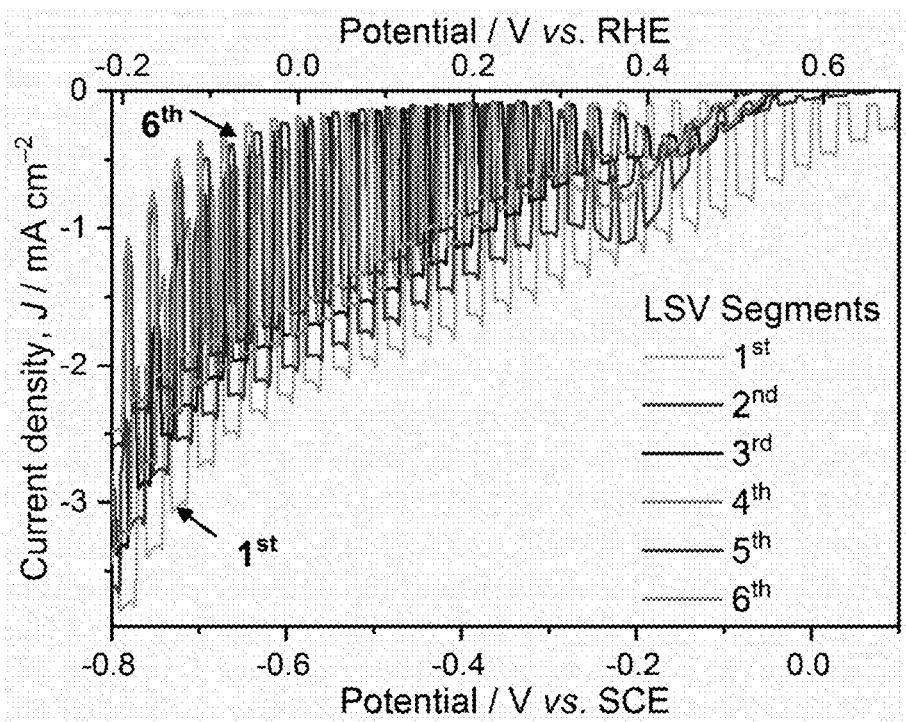
FIG. 15 is the photocurrent responses of as-grown $Cu_2O$ in 0.5 M $Na_2SO_4$ under 1 sun illumination and the reductive photodecomposition of $Cu_2O$ upon repetitive runs.

FIG. 15 shows the linear sweep voltammetry curves of as-grown $Cu_2O$ under standard chopped light illumination measured in 0.5 M $Na_2SO_4$ for successive six segments. For the 1st segment, the dark current is negligible with onset of photocurrent toward more positive potential. The onset of dark current is at −0.6 V vs. saturated calomel electrode, which reflects the corrosion reaction. Under light illumination, the photogenerated electron-hole pairs are generated in the valence band of the $Cu_2O$ film. Upon separation, the electrons travel to the conduction band of $Cu_2O$ and reduce protons at the solid-liquid interface to form $H_2$ gas. The OH⁻ ions are oxidized at the counter electrode to produce $O_2$ and water. Hence, the photocurrent generated depends on how effectively the photogenerated electron-holes are separated without any losses. The photocurrent density measured at −0.6 V vs. saturated calomel electrode (0 V vs. reversible hydrogen electrode) is −2.4 mA cm⁻², which is in line with the reported literature (Paracchino A et al. Nat. Mater. 2011, 10, 456-461). However, the recurring reduction peaks appear at −0.15/−0.20 V vs. saturated calomel electrode (0.4 V vs. reversible hydrogen electrode) during J-V measurements from 2$^{nd}$ segment onwards, which is an indication of photo-corrosion because $Cu_2O$ undergoes reductive decomposition to Cu upon repetitive photocurrent measurements. Such change in chemical state of $Cu_2O$ film after photo-electrochemical measurement is witnessed visually by color change from reddish brown to black and by decrement in photoelectrochemical current density. This phenomenon has been previously confirmed by scanning electron microscopy and XPS techniques (Paracchino A et al. Nat. Mater. 2011, 10, 456-461). Thus, the $Cu_2O$ layer needs corrosion-protection to avoid direct contact between $Cu_2O$ and the electrolyte. To suppress the photo-corrosion reaction, the $Cu_2O$ surface was passivated with $MoS_2$ layer to prevent contact with the electrolyte by using spin-coating and thermal annealing treatment.

Figure 16:
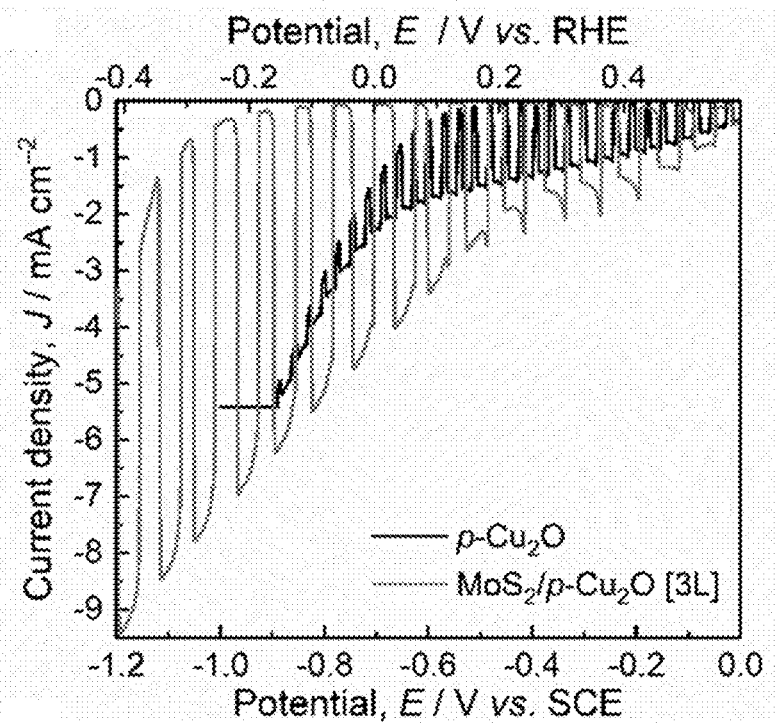
FIG. 16 is the photocurrent responses of as-grown $Cu_2O$ and $N_2$-annealed $MoS_2$-protected $Cu_2O$ photocathodes in 0.5 M $Na_2SO_4$ under 1 sun illumination, where the spin-coating layer of 2.5 mM $MoS_2$ precursor is 3 layers (3L).

FIG. 16 shows the photocurrent responses of as-grown $Cu_2O$ and $MoS_2$-protected $Cu_2O$ photocathodes with three of spin-coated layers of $MoS_2$. The photocurrent of $Cu_2O$ increases significantly upon $MoS_2$ protection. The photocurrent densities of −3.0 mA cm⁻² at 0 V vs. reversible hydrogen electrode and as high as −6.5 mA cm⁻² at −0.4 V vs. reversible hydrogen electrode are obtained for 3-layered $MoS_2$-coated $Cu_2O$ photocathode. The contribution to the photocurrent due to light absorption by the $MoS_2$-protective overlayer is negligible under standard 1 sun illumination as $MoS_2$ is not a photoactive material. Additionally, the dark current characteristics of the $Cu_2O$ photocathodes are improved considerably. The reduction peak observed for as-grown $Cu_2O$ disappears for $MoS_2$-coated $Cu_2O$ photocathode, with no change in film color, indicating that the $Cu_2O$ surface is completely passivated by the $MoS_2$ layer. The onset of dark current appears at −0.98 V vs. saturated calomel electrode (−0.4 V vs. reversible hydrogen electrode), which is well below the water reduction potential (0 V vs. reversible hydrogen electrode), thereby avoiding the photo-corrosion of $Cu_2O$. With increasing number of $MoS_2$ layers, the darkening of the film caused by photo-corrosion is reduced. With increasing $MoS_2$ thickness beyond 3 layers, however, the photocurrent decreases, which is likely because of blocking of the light by the $MoS_2$ film and consequent decrease of irradiation on the $Cu_2O$ electrode.

Figure 17:
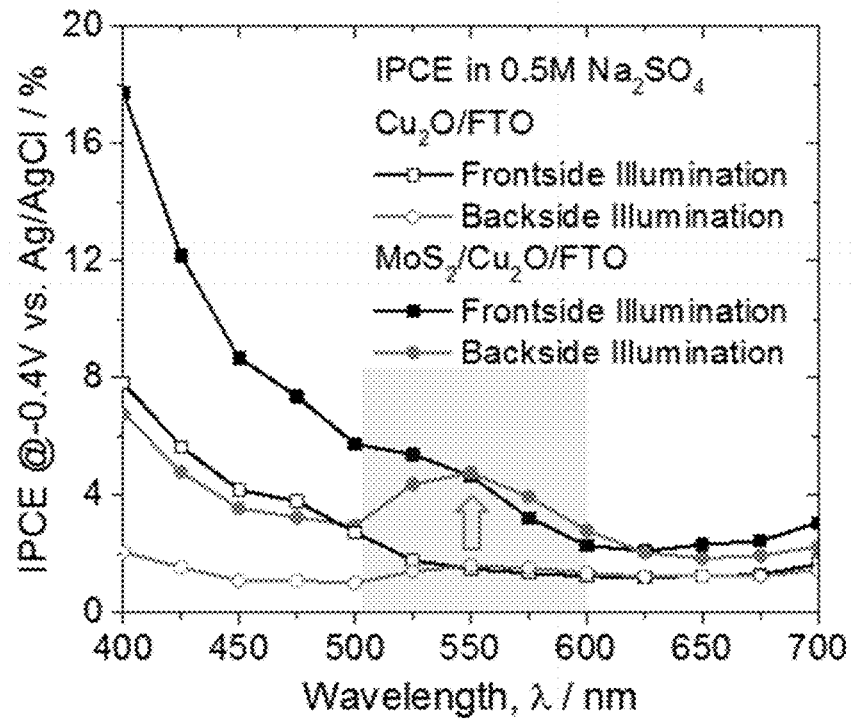
FIG. 17 is the action spectra of the $Cu_2O$ (open symbols) and $MoS_2/Cu_2O$ (closed symbols) photocathodes at $-0.4$ V vs. Ag/AgCl ($\sim 0.2$ V vs. reversible hydrogen electrode) under front-side (square) and back-side (circle) illumination.
Figure 18:
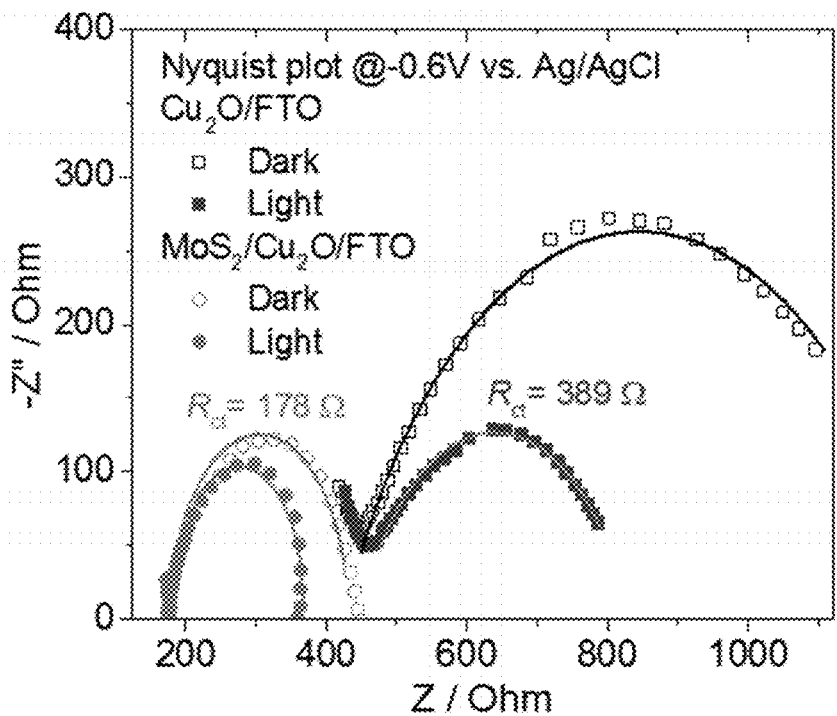
FIG. 18 is the Nyquist plots of the $Cu_2O$/FTO and $MoS_2$/FTO electrodes recorded at a fixed applied potential of $-0.6$ V vs. Ag/AgCl both in dark and under light, respectively. The symbols and the solid lines represent the experimental and fitted data, respectively. The diameter of the semicircle represents the charge transfer resistance, Ret.
Figure 19:
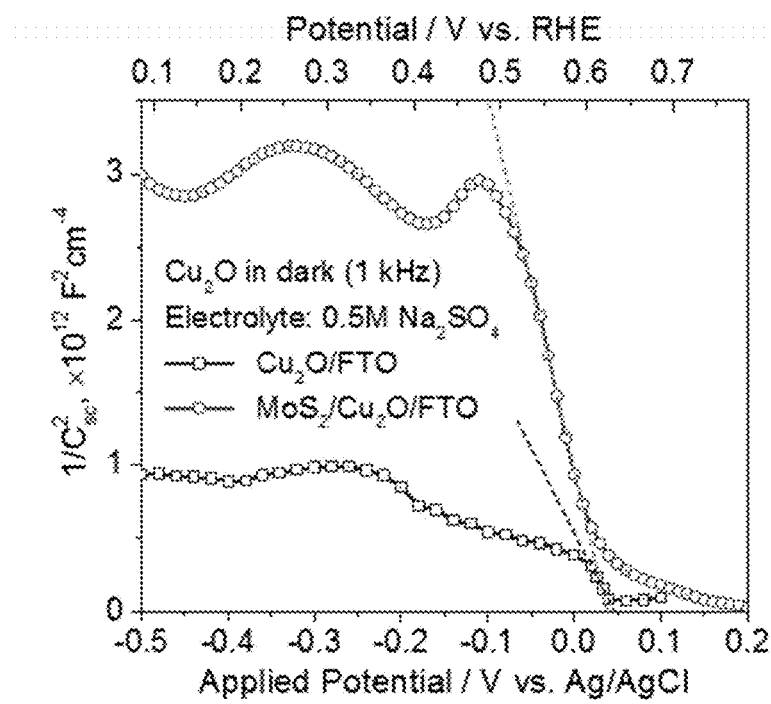
FIG. 19 is the Mott-Schottky plots of the $Cu_2O$/FTO and $MoS_2$/FTO electrodes measured at 1 kHz frequency in dark. Electrolyte: 0.5 M $Na_2SO_4$ solution (pH=~6.7); Light source: a 300 W Xe lamp; Illumination: simulated 1 sun (100 mWcm$^{-2}$).
Figure 20:
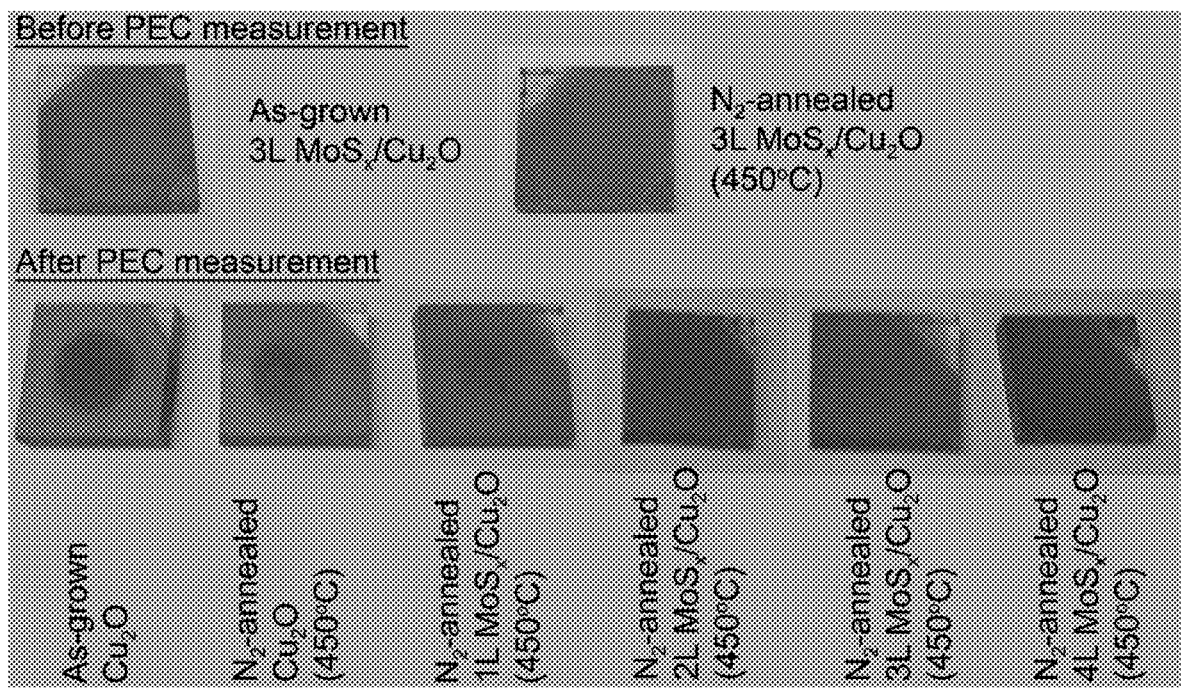
FIG. 20 is a photograph of as-grown $Cu_2O$ and $N_2$-annealed $MoS_2$-coated $Cu_2O$ samples after photoelectrochemical measurement. Color change from reddish brown to black indicates reductive photodecomposition of $Cu_2O$ to Cu.

The incident photon-to-current conversion efficiency is employed as a valuable diagnostic figure of merit for most photoelectrochemical devices. The incident photon-to-current conversion efficiency values were calculated using the relation, incident photon-to-current conversion efficiency (%)=$[(1240/\lambda) \times (J_{light} - J_{dark})/P_i] \times 100$, where $\lambda$ is the wavelength of incident monochromatic light, $J_{light}$ is the steady-state photocurrent density at given $\lambda$, $J_{dark}$ is the dark current density and $P_i$ is the power density of incident monochromatic light. FIG. 17 shows the action spectra of $Cu_2O$ and 3-layered $MoS_2/Cu_2O$ photocathodes at −0.4 V vs. Ag/AgCl (~0.2 V vs. reversible hydrogen electrode) under front- and backside illumination. FIG. 17 suggests that higher incident photon-to-current conversion efficiency values are observed at lower wavelengths. However, the $Cu_2O$ sample shows a noticeable shoulder around 475 nm for front-side illumination, which slightly shifts toward more visible wavelengths (~530 nm) upon $MoS_2$ coating on $Cu_2O$. Additionally, the incident photon-to-current conversion efficiency peak is prominent for backside illumination for the $MoS_2/Cu_2O$ sample. The incident photon-to-current conversion efficiency of any device is closely associated with the photo-absorption ability of the photoactive layer. Electrodeposited $Cu_2O$ films show an absorption peak at around ~500 nm, however, they are prone to defect formation like in ZnO, which results in deep-level defects such as oxygen vacancies or copper interstitials (Laidoudi S et al. Sem. Sci. Technol. 2013, 28, 115005; Paul G K et al. Appl Phys Lett 2006, 88, 141901). These defects enable recombination of charge carriers, which causes lower incident photon-to-current conversion efficiency values. However, $MoS_2$ serves as a defect-passivating layer on $Cu_2O$, which to some extent lowers the charge carrier recombination in the visible region (where $Cu_2O$ absorbs maximum visible light). This is the reason why $MoS_2/Cu_2O$ photocathode shows relatively high incident photon-to-current conversion efficiency values under both front- and backside illumination. To further elucidate on the contributing factors toward the photocurrent enhancement, the electrochemical impedance spectroscopy and Mott-Schottky measurements are performed. Electrochemical impedance spectroscopy analysis sheds light on the charge-transfer processes occurring at the electrolyte interface, while Mott-Schottky analysis is commonly employed to determine the type and concentration of majority charge carriers as well as the built-in voltage of the system. FIG. 18 shows the Nyquist plots of $Cu_2O$ and 3-layered $MoS_2/Cu_2O$ electrodes obtained at −0.6 V vs. Ag/AgCl (~0.0 V vs. reversible hydrogen electrode) in the dark and under front-side illumination. The Nyquist curves were fitted using an equivalent circuit comprising a series resistance ($R_s$) and two RC (resistance and capacitance) circuits in parallel. $R_s$ is a sum of all the serial resistances consisting of the electrolyte, contact, electrode and cables. It is noteworthy that $Cu_2O$/FTO electrode shows higher $R_s$ value (~420Ω) than that of $MoS_2/Cu_2O$/FTO electrode (<200Ω). Additionally, the charge transfer resistance (Ret), typically the diameter of the semicircle, is inversely related to the photocurrent of the photoelectrochemical system. The corresponding decrease in $R_{ct}$ value with the addition of $MoS_2$ as a protecting layer (interfacial layer between $Cu_2O$ and electrolyte) on $Cu_2O$/FTO both in the dark as well under illumination implies that charge carrier resistance at the photocathode-electrolyte interface is significantly improved. Under illumination, the $R_{ct}$ value decreases considerably from 389 to 178Ω after coating $MoS_2$ layer on $Cu_2O$. The $MoS_2$ coating not only protects the surface of $Cu_2O$ electrode from reductive decomposition but also facilitates the charge transfer properties of $Cu_2O$ and hence actively contributes to photocurrent enhancement resulting from photoelectrochemical water reduction. In other words, $MoS_2$ passivates the defect states, such as Cu vacancies in $Cu_2O$, additionally helping avoid the recombination of charge carriers. Thus, it can be established that $MoS_2$ at interface promotes the effective shuttling of the charge carriers at the photocathode-electrolyte interface, which may be due to the formation of the nanojunctions (Mahmood A et al. J. Mater. Sci. 2017, 28, 12937-12943). The interfacial space-charge capacitance ($C_{sc}$), which varies as function of applied potential (V), is another important parameter to describe a photoelectrode/electrolyte interface that can be used to estimate the flat band potential and the majority carrier density of a semiconductor from the slope of Mott-Schottky plot using Equation (1) (Yang Y et al. Sci. Rep. 2016, 6, 35158):

$$N_A = (2/e_0 \varepsilon \varepsilon_o) |d(C_{sc}^{-2})/dV| \quad (1)$$

where $N_A$ is the acceptor density (hole density in for p-type $Cu_2O$), $e_o$ is the electron charge, $\varepsilon_o$ is the permittivity of the vacuum, $\varepsilon$ is the dielectric constant of the semiconductor (7.60 for $Cu_2O$). FIG. 19 shows the Mott-Schottky plots of the $Cu_2O$ and 3-layered $MoS_2/Cu_2O$ electrodes obtained at 1 kHz ac frequency in the dark. The negative slope of the Mott-Schottky plots confirms the p-type conductivity of $Cu_2O$ electrodes. The $N_A$ value decreases from $4.5 \times 10^{19}$ $cm^{-3}$ to $2.4 \times 10^{19}$ $cm^{-3}$ after coating $MoS_2$ on $Cu_2O$. This can understandably be attributed to the fact that p-type conductivity of electrodeposited $Cu_2O$ originates primarily from defects such as Cu vacancies. The defects or hole traps 0.40-0.55 eV above the top of the valence band maximum are verified in $Cu_2O$ by deep level transient spectroscopy (Paul G K et al. Appl Phys Lett 2006, 88, 141901), which are attributed to structural anomalies such as CuO islands (Scanlon D O et al. J Chem Phys 2009, 131, 124703). Such defects are passivated after surface coating with $MoS_2$, resulting in reduced hole densities. Similar $N_A$ values are reported in the literature for pristine and protected $Cu_2O$ electrodes (Choi J et al. Electron. Mater. Lett. 2017, 13, 57-65; Zhang Z et al. J. Mater. Chem. 2012, 22, 2456-2464). The extrapolated straight portion of the Mott-Schottky plot on the X-axis at $C_{sc}=0$ gives the flat band potential ($E_{fb}$) of the material. No noticeable change in $E_{fb}$ is observed after $MoS_2$ coating. The $E_{fb}$ value for both the $Cu_2O$ and $MoS_2/Cu_2O$ electrodes is 0.63±0.005 V vs. reversible hydrogen electrode, which is in line with the reported values (Yang Y et al. Sci. Rep. 2016, 6, 35158; Zhang Z et al. J. Mater. Chem. 2012, 22, 2456-2464). FIG. 20 shows the photographs of as-grown $Cu_2O$ and $N_2$-annealed $MoS_2$-protected $Cu_2O$ photocathodes with different number of spin-coated layers, both before and after the photoelectrochemical measurement. The photographs of $Cu_2O$ electrodes clearly suggest that the color of the $Cu_2O$ film area performing water reduction reaction is unchanged after photoelectrochemical measurement with increasing number of spin-coated layers of $MoS_2$. In other words, $MoS_2$ layer passivates the reductive photo-decomposition of $Cu_2O$ to Cu, protects the chemical state of electrode, resulting in improved photoelectrochemical water reduction performance.

Figure 21:
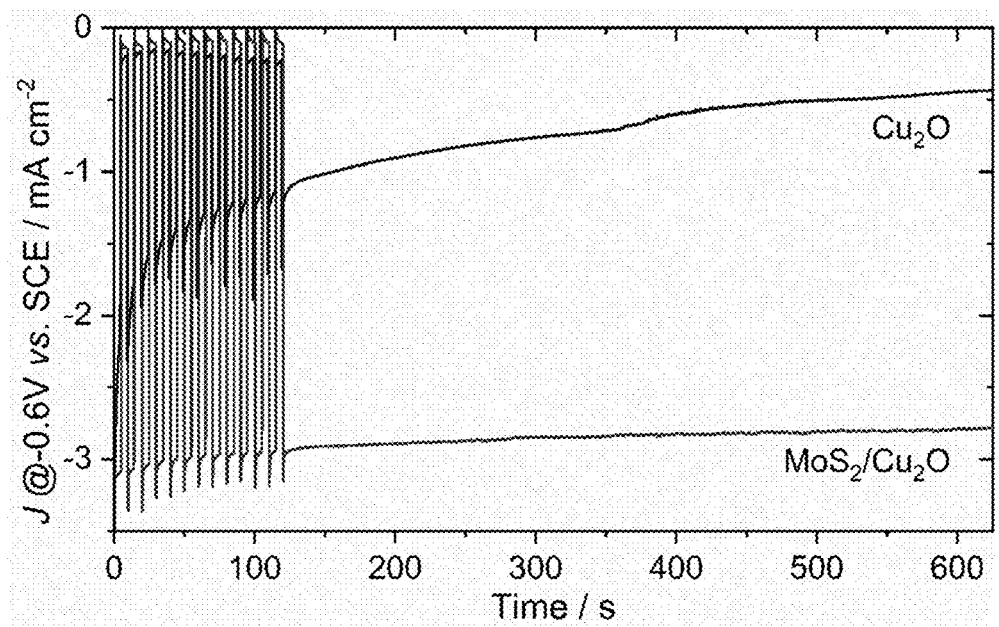
FIG. 21 shows the photo-stability of a composite $MoS_2$-modified $Cu_2O$ electrode and a pristine unmodified $Cu_2O$ electrode in a near-neutral 0.5 M $Na_2SO_4$ electrolyte at a constant potential of −0.6 V vs. saturated calomel electrode, sat. KCl (SCE). The composite $MoS_2$-modified $Cu_2O$ electrode shows only 9% loss in its photo-stability whereas the pristine unmodified $Cu_2O$ electrode shows 77% decrease after 10 min.
Figure 22:
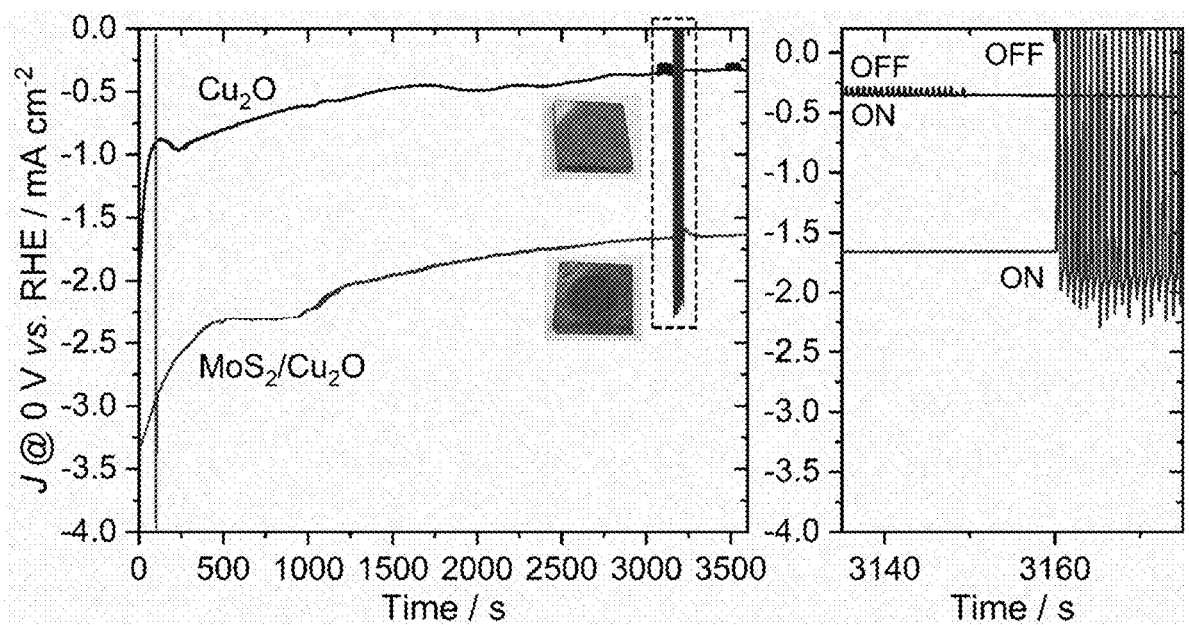
FIG. 22 shows the results of a long-term photostability test of as-grown $Cu_2O$ and $MoS_2$-modified $Cu_2O$ photocathodes at an applied potential of 0 V vs. reversible hydrogen electrode for 1 h in 0.1 M phosphate buffered (pH ~7) 0.5 M $Na_2SO_4$ electrolyte.

In some examples, the composite electrode can have a relatively better photo-stability in a near-neutral 0.5 M $Na_2SO_4$ electrolyte at a constant potential of –0.6 V vs. SCE. The composite $MoS_2$-modified $Cu_2O$ electrode shows only 9% loss in its photo-stability whereas the pristine unmodified $Cu_2O$ electrode shows 77% decrease after 10 min (FIG. 21). Long-term photostability tests of as-grown $Cu_2O$ and $MoS_2$-modified $Cu_2O$ photocathodes at an applied potential of 0 V vs. reversible hydrogen electrode for 1 h in 0.1 M phosphate buffered (pH ~7) 0.5 M $Na_2SO_4$ electrolyte shows promising results of $MoS_2$ modification. The pristine $Cu_2O$ photocathode exhibits a large dark current and a decline in photocurrent at the end of the 1-hour stability test, whereas the $MoS_2$-modified $Cu_2O$ photocathode exhibited a negligibly small dark current with appreciable photocurrent (FIG. 22). XRD study confirmed the presence of metallic Cu in the pristine $Cu_2O$ photocathode after the 1 h stability test, unlike the $MoS_2$-modified $Cu_2O$ photocathode. Thus, loss of photoactivity can be due to the conversion of $Cu_2O$ to Cu in the pristine $Cu_2O$ electrode, which can be avoided due to $MoS_2$ modification on $Cu_2O$.

In summary, a strategy of combining an electrodeposition/spin-coating technique and post-annealing treatment was described that paves the way for an economically viable, and scalable process of fabricating stable and efficient copper-oxide-based photocathode materials for photoelectrochemical hydrogen production. The photocorrosion problem associated with electrodeposited p-type $Cu_2O$ photocathode is addressed by spin-coating a thin ~40 nm $MoS_2$ layer onto the surface using a $MoS_2$ precursor complex. The $MoS_2$ coating not only prevents the reductive photodecomposition of $Cu_2O$ to Cu but also enhances the overall photoelectrochemical activity of the photocathode. The catalytic activity of $MoS_2$ using such complex precursors can be tuned by controlling the number of spin-coated layers and the annealing temperature in $N_2$ atmosphere. Additionally, the action spectra indicate that $MoS_2$ coating helps reduce the recombination of photogenerated charge carriers, thereby improving the light absorptivity of $Cu_2O$. Electrochemical impedance spectroscopy measurements of $MoS_2$-modified $Cu_2O$ suggests improvements in interface properties that lead to the enhanced separation of electron-hole pairs as well as reduced carrier recombination because of decrease in interfacial defects or hole traps. The $MoS_2$-modified $Cu_2O$ photocathodes exhibit photocurrent densities as high as 6.5 mA cm$^{-2}$ at –0.4 V vs. reversible hydrogen electrode in 0.5 M $Na_2SO_4$ electrolyte under standard 1 sun illumination conditions, which make them potential candidates for a self-assisted hybrid water splitting system for hydrogen fuel generation. These spin-coatable molybdenum disulfide layers are attractive as a catalytically active thin-film passivation layer for several other unstable semiconductor water-splitting materials. Further, these p-type photocathode systems can be combined with an n-type photoanode system to establish a cost-effective and efficient unassisted photoelectrochemical water splitting system to produce hydrogen fuel.

Other advantages which are obvious and which are inherent to the invention will be evident to one skilled in the art. It will be understood that certain features and sub-combinations are of utility and may be employed without reference to other features and sub-combinations. This is contemplated by and is within the scope of the claims. Since many possible examples may be made of the invention without departing from the scope thereof, it is to be understood that all matter herein set forth or shown in the accompanying drawings is to be interpreted as illustrative and not in a limiting sense.

What is claimed is:
1. A method for forming a composite electrode, comprising:
depositing a precursor solution onto a substrate, thereby forming a precursor electrode comprising a precursor layer disposed on the substrate; and
thermally annealing the precursor electrode, thereby forming a composite electrode comprising a $MoS_2$ layer disposed on the substrate;
wherein the substrate comprises a semiconductor substrate and/or a conductive substrate; and
wherein the precursor solution comprises a precursor compound having a formula I:

$$[Mo_3S_y(S_2CNR_2)_z]X_{4-z} \qquad \text{I}$$

wherein
y is 4 or 7;
z is 3 or 4, with the proviso that when y is 7, z is 3;
R is a substituted or unsubstituted $C_1$-$C_{15}$ alkyl group, a substituted or unsubstituted $C_2$-$C_{15}$ alkenyl group, a substituted or unsubstituted $C_2$-$C_{15}$ alkynyl group, or a substituted or unsubstituted $C_3$-$C_{20}$ aryl group; and
X is a halide anion, a tetrafluoroborate anion, or a hexafluorophosphate anion.
2. The method of claim 1, wherein X is a halide anion.
3. The method of claim 1, wherein X is an iodine anion.
4. The method of claim 1, wherein the precursor compound has a formula A:

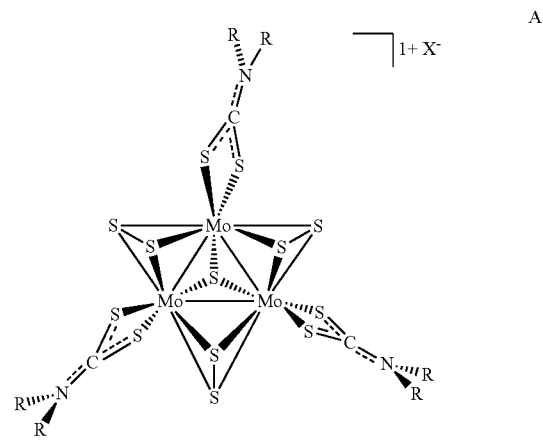

wherein the dotted lines between S, C, and N represent single or double bonds, as valence permits.

5. The method of claim 1, wherein the precursor compound has a formula B:

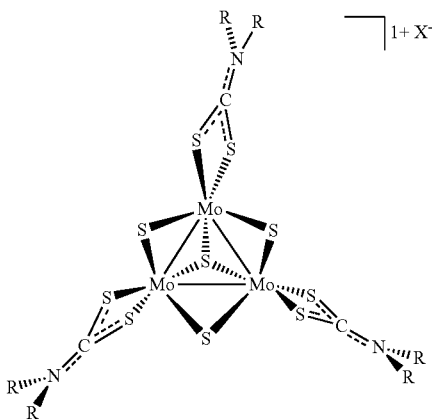

wherein the dotted lines between S, C, and N represent single or double bonds, as valence permits.

6. The method of claim 1, wherein the precursor compound has a formula C:

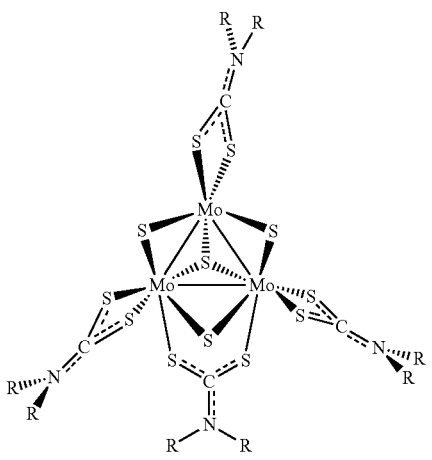

wherein the dotted lines between S and C, and C and N represent single or double bonds, as valence permits.

7. The method of claim 1, wherein R is a substituted or unsubstituted $C_1$-$C_4$ alkyl.

8. The method of claim 1, wherein R is an unsubstituted $C_1$-$C_4$ alkyl.

9. The method of claim 1, wherein R is ethyl.

10. The method of claim 1, wherein R is a substituted or unsubstituted $C_{10}$-$C_{15}$ aryl.

11. The method of claim 10, wherein R is a substituted $C_{10}$-$C_{15}$ aryl.

12. The method of claim 10, wherein R is 3,5-di-tert-butylbenzyl.

13. The method of claim 1, wherein the concentration of the precursor compound in the precursor solution is from 10 nM to 50.0 mM.

14. The method of claim 1, wherein the precursor solution is deposited onto the substrate by spin coating, spray coating, physical vapor deposition, chemical vapor deposition, or a combination thereof.

15. The method of claim 1, wherein the substrate comprises:
a semiconductor substrate comprising a semiconductor selected from the group consisting of $TiO_2$, $Cu_2O$, $CuFeO_2$, Si, InGaN, InGaP, InP, and combinations thereof;
a conductive substrate comprising Cu, Ag, Au, Fe, Ti, Al, Pt, C, indium doped tin oxide (ITO), fluorine doped tin oxide (FTO), or a combination thereof; or
a layer comprising a semiconductor disposed on a conductive substrate and wherein the semiconductor is selected from the group consisting of $TiO_2$, $Cu_2O$, $CuFeO_2$, Si, InGaN, InGaP, InP, and combinations thereof.

16. The method of claim 1, wherein the $MoS_2$ layer has an average thickness of from 1 nm to 200 nm.

* * * * *